(12) United States Patent
Shimura et al.

(10) Patent No.: US 11,362,024 B2
(45) Date of Patent: Jun. 14, 2022

(54) SEMICONDUCTOR DEVICE AND METHOD OF MANUFACTURING THE SAME

(71) Applicant: SUMITOMO ELECTRIC DEVICE INNOVATIONS, INC., Kanagawa (JP)

(72) Inventors: Hisashi Shimura, Yokohama (JP); Yoshiyasu Kuwabara, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 16/425,369

(22) Filed: May 29, 2019

(65) Prior Publication Data

US 2019/0371714 A1 Dec. 5, 2019

(30) Foreign Application Priority Data

May 30, 2018 (JP) .............................. JP2018-103823
Feb. 28, 2019 (JP) .............................. JP2019-035716

(51) Int. Cl.
| | | |
|---|---|---|
| *H01L 23/495* | (2006.01) | |
| *H01L 29/267* | (2006.01) | |
| *H01L 29/78* | (2006.01) | |
| *H01L 21/56* | (2006.01) | |
| *H01L 23/31* | (2006.01) | |

(52) U.S. Cl.
CPC ...... *H01L 23/49562* (2013.01); *H01L 21/561* (2013.01); *H01L 23/3121* (2013.01); *H01L 23/49582* (2013.01); *H01L 29/267* (2013.01); *H01L 29/78* (2013.01)

(58) Field of Classification Search
CPC .......... H01L 23/49562; H01L 23/3121; H01L 23/49582; H01L 29/267; H01L 29/78; H01L 21/561
See application file for complete search history.

(56) References Cited

U.S. PATENT DOCUMENTS

| | | | |
|---|---|---|---|
| 2008/0157347 | A1 | 7/2008 | Takashima |
| 2014/0264383 | A1* | 9/2014 | Kajiwara ............ H01L 23/4952 257/77 |
| 2018/0240942 | A1 | 8/2018 | Ootorii |
| 2019/0172812 | A1* | 6/2019 | Okabe ..................... H01L 29/78 |

FOREIGN PATENT DOCUMENTS

| | | |
|---|---|---|
| JP | 2008-166579 | 7/2008 |
| JP | 2013-93491 | 5/2013 |
| JP | 2015-153966 | 8/2015 |
| JP | 2017-108192 | 6/2017 |
| WO | 2017/037996 | 3/2017 |

* cited by examiner

*Primary Examiner* — Sue A Purvis
*Assistant Examiner* — Scott Stowe
(74) *Attorney, Agent, or Firm* — Smith, Gambrell & Russell, LLP.

(57) ABSTRACT

A semiconductor device includes a semiconductor chip in which a field effect transistor mainly containing GaN is formed on a surface of a SiC semiconductor substrate. The semiconductor device includes a metal base on which a back surface of the semiconductor chip is mounted through a conductive adhesive material containing Ag and a resin mold configured to seal the semiconductor chip. A metal having wettability lower than wettability of Au or Cu with respect to Ag is exposed in a region extending along an edge of the back surface.

6 Claims, 26 Drawing Sheets

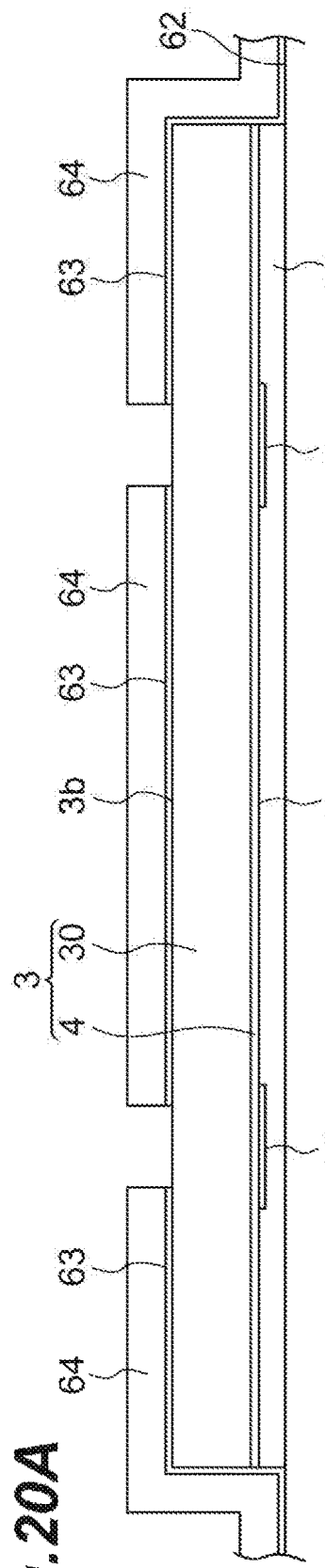
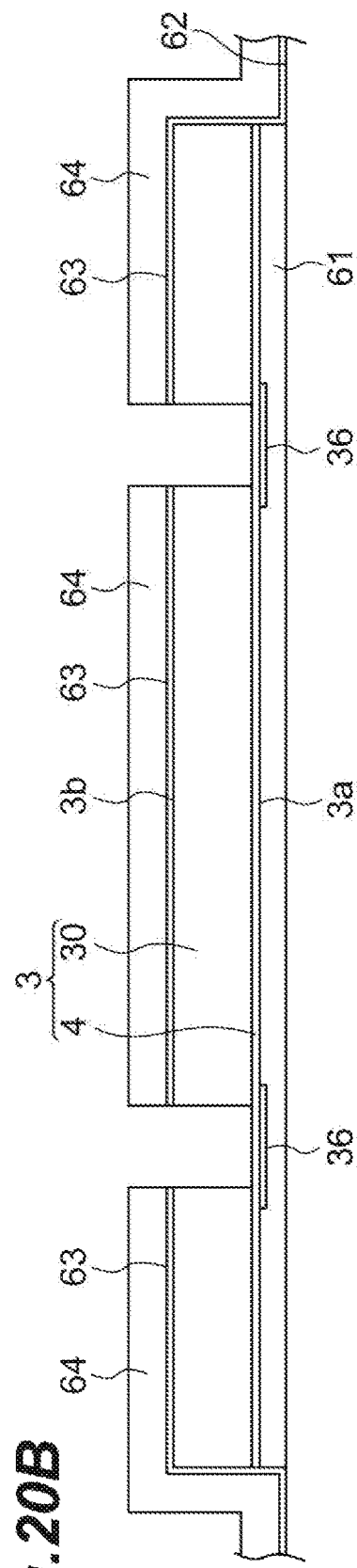
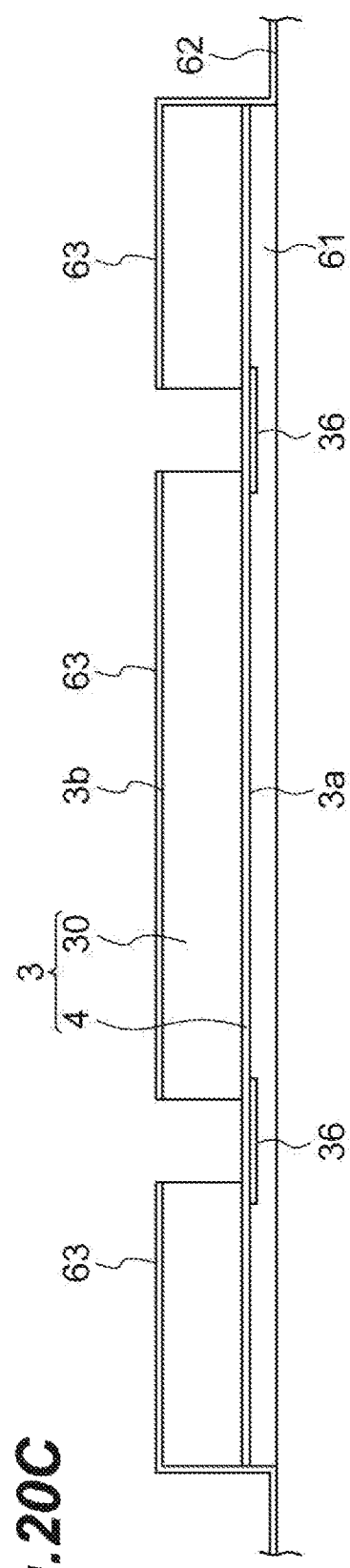

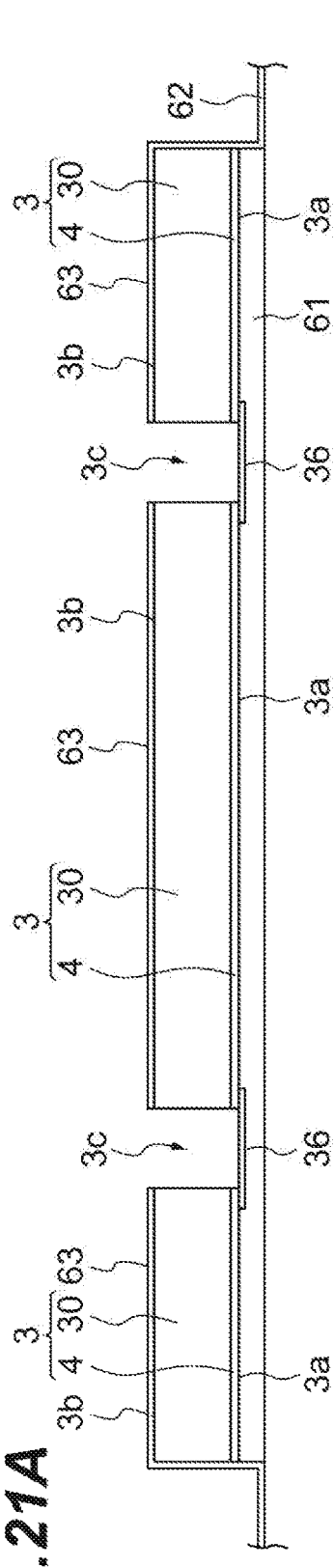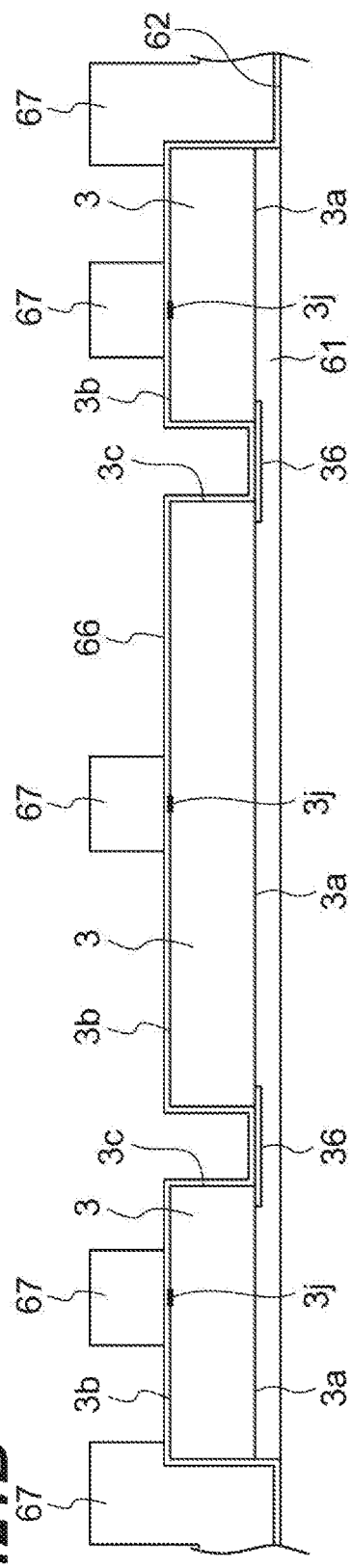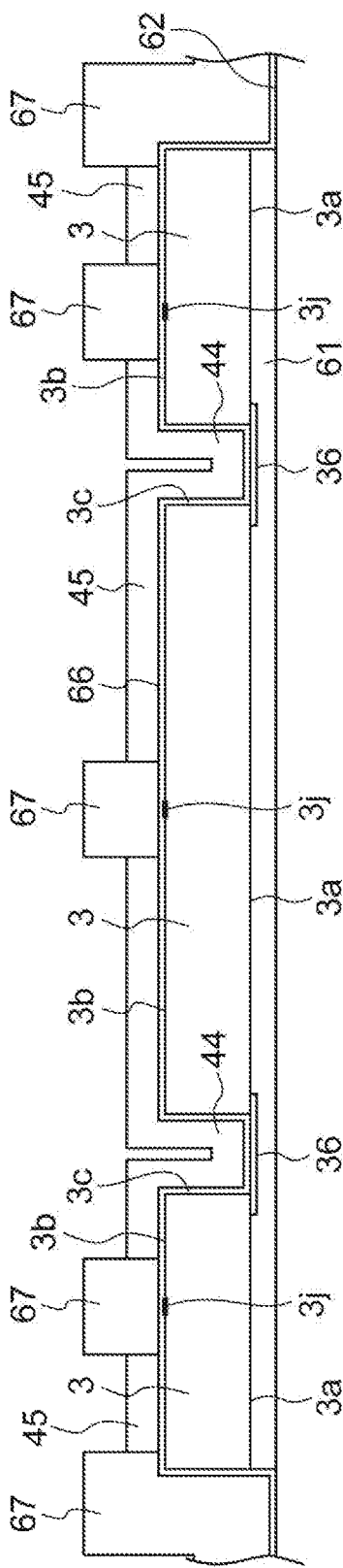

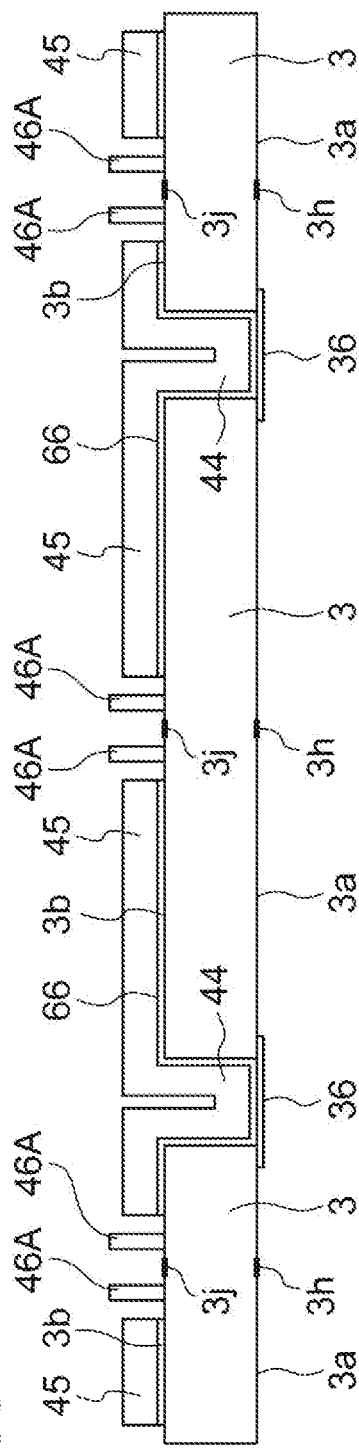
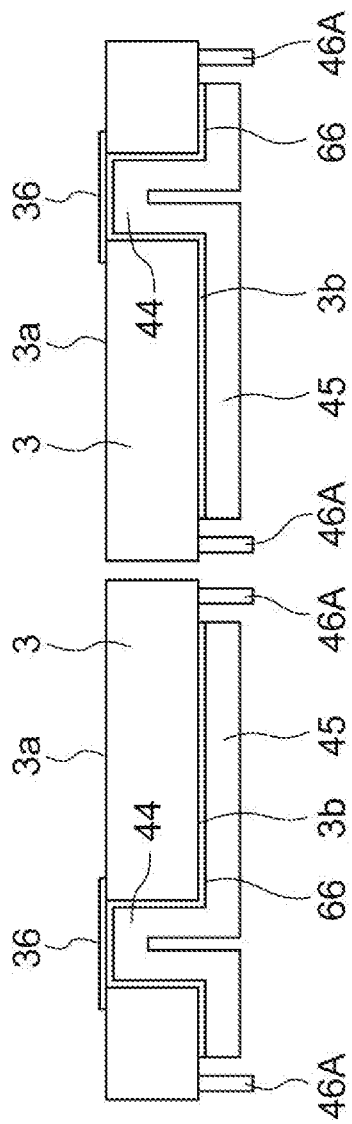
Fig.23A
Fig.23B

*Fig.24A* *Fig.24B*
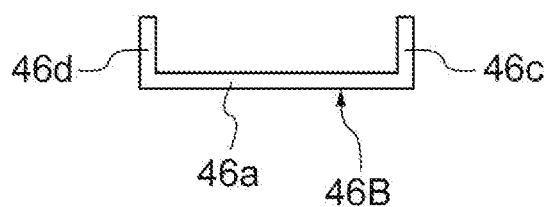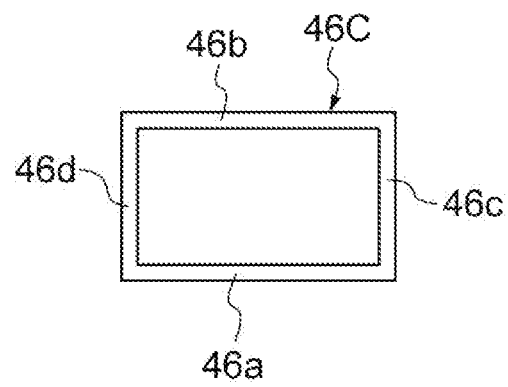

SEMICONDUCTOR DEVICE AND METHOD OF MANUFACTURING THE SAME

CROSS REFERENCE TO RELATED APPLICATION

This application claims the priority benefit of Japanese Applications No. JP2018-103823 filed on May 30, 2018 and JP2019-035716 filed on Feb. 28, 2019, the entire contents of which are incorporated herein by references.

TECHNICAL FIELD

The present disclosure relates to a semiconductor device and a method of manufacturing the same.

BACKGROUND

Japanese Unexamined Patent Publication No. 2013-093491 discloses a semiconductor device including a conductive base plate, a first adhesive disposed on the conductive base plate and containing a conductive metal component, and a semiconductor chip disposed on the first adhesive and bonded to the conductive base plate. In order to suppress migration due to the first adhesive, an example is disclosed in which the second adhesive containing no conductive metal component is disposed on the outer periphery of the bonding surface between the semiconductor chip and the conductive base plate, on the conductive base plate. The second adhesive coats the first adhesive.

The source electrode provided on the surface of the semiconductor chip in which the field effect transistor (FET) is formed is connected to the back electrode through the via formed in the substrate. The back electrode is provided on the entire back surface of the semiconductor chip. The die mounting of the semiconductor chip on the package is performed by connecting the entire back electrode to the package via a brazing material (conductive resin such as silver paste, also called conductive bonding material).

In the case of a non-hermetically sealed package, it is not possible to suppress entry of moisture into the package. Therefore, ionization of silver (Ag) in the brazing material is accelerated by the presence of moisture in the side wall portion of the semiconductor chip. In addition, silver ions (Ag$^+$) are attracted to the electrode by an electric field applied to the electrode. That is, the so-called electromigration of silver ions (crawling up a conductive adhesive, also referred to as ion migration) is generated. The ion migration is a phenomenon in which ionized metal moves on the surface of a substance between electric fields. Metal ions are attracted to the electric field, reduce from the ionized state to metal for some reason, and accumulate to form dendrites. When metal dendrite grows from the conductive bonding material, the electrode pad and the backside metal film short circuit, resulting in the failure of the semiconductor device.

In the semiconductor device disclosed in Japanese Unexamined Patent Publication No. 2013-093491, the migration is suppressed by solidifying the surface of the first adhesive containing the conductive metal component with the second adhesive containing no conductive metal component. However, to solidifying the exposed surface of the first adhesive, which is a bonding resin, another resin (that is, the second adhesive) is required. Moreover, two heating processes are required for the coating process. Furthermore, it is not easy to apply an appropriate amount of the second adhesive only around the chip.

SUMMARY

A method of manufacturing a semiconductor device according to an aspect of the present disclosure includes: forming a field effect transistor mainly including GaN on a surface of a SiC semiconductor substrate in which formation regions for semiconductor chips are formed, the formation regions being partitioned by scribe lines having a first width; forming a first metal layer over an entire back surface of the SiC semiconductor substrate wherein the first metal layer has wettability lower than wettability of Au or Cu with respect to Ag; forming a second metal layer made of Au on a first region of the first metal layer, the first region being not overlapped with the scribe line; individualizing the semiconductor chips by dicing the SiC semiconductor substrate with a second width narrower than the first width along the scribe lines; and mounting the semiconductor chip on a metal base through a conductive adhesive member containing Ag.

The semiconductor device according to an aspect of the present disclosure includes a semiconductor chip in which a field effect transistor mainly containing GaN is formed on a surface of a SiC semiconductor substrate. The semiconductor device includes a metal base on which a back surface of the semiconductor chip is mounted through a conductive adhesive material containing Ag, and a resin mold configured to seal the semiconductor chip, wherein a metal having wettability lower than wettability of Au or Cu with respect to Ag is exposed in a region extending along an edge of the back surface.

A method of manufacturing a semiconductor device according to an aspect of the present disclosure includes: disposing an electrode pad along a scribe region on a main surface of a substrate, the substrate having, on the main surface, a plurality of device regions surrounded by the scribe region; forming a backside metal film, on a back surface of the substrate, spaced away from a first region in which the scribe region is projected on the back surface; forming a polyimide wall extending along an edge of the backside metal film on a second region between the first region and the backside metal film; and cutting the substrate along the scribe region to produce semiconductor chips each including the device region.

A semiconductor device according to an aspect of the present disclosure includes a substrate having a main surface and a back surface, the main surface including a device region, an electrode pad provided on the main surface along a side face of the substrate, a backside metal film provided on the back surface, the backside metal film being spaced away from the side face of the substrate, and a polyimide wall provided on the back surface between the side face of the substrate and the backside metal film, the polyimide wall extending along an edge of the backside metal film.

BRIEF DESCRIPTION OF THE DRAWINGS

The foregoing and other purposes, aspects and advantages will be better understood from the following detailed description of a preferred embodiment of the disclosure with reference to the drawings, in which:

FIGS. 20A to 20C are cross-sectional views showing the latter half of the respective steps included in the method of manufacturing the transistor 1A;

FIGS. 21A to 21C are cross-sectional views showing the latter half of the respective steps included in the method of manufacturing the transistor 1A;

FIGS. 23A and 23B are cross-sectional views showing the latter half of the respective steps included in the method of manufacturing the transistor 1A;

FIGS. 24A and 24B are views showing a modification of a polyimide wall; and

DETAILED DESCRIPTION

Figure 1A:
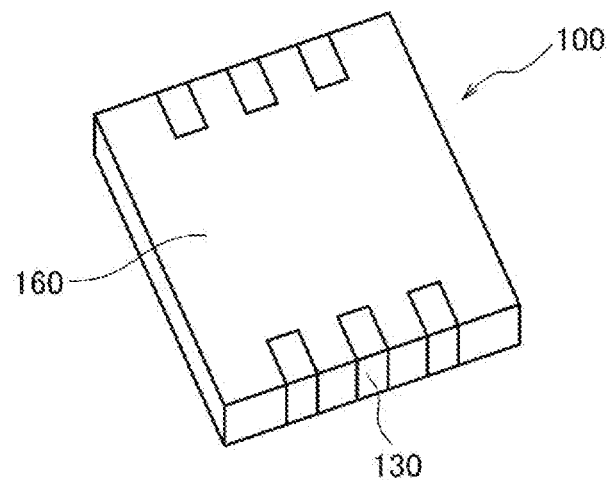
FIG. 1A is an external view of a semiconductor device according to a first embodiment as viewed from the front side (upper side)

[Description of the Embodiment of the Present Disclosure]

First, the embodiment of the present disclosure will be listed and described.

A method of manufacturing a semiconductor device according to an embodiment of the present disclosure includes forming a field effect transistor mainly composed of GaN on a surface of a semiconductor substrate in which formation regions for semiconductor chips are formed, the formation region being partitioned by scribe lines having a predetermined width, the semiconductor substrate being made of SiC, forming a first metal layer over an entire back surface of the semiconductor substrate wherein the first metal layer has wettability lower than wettability of Au or Cu with respect to Ag, forming a second metal layer, made of Au, on a region of the first metal layer, the region excluding a region of an inside of the predetermined width of the scribe line, individualizing the semiconductor chips by dicing the semiconductor substrate with a width narrower than the predetermined width along the scribe lines, and mounting the semiconductor chips on a metal base through a conductive adhesive member containing Ag.

According to this method of manufacturing a semiconductor device, it is possible to suppress ion migration due to a conductive adhesive without hardening the surface of the conductive adhesive member containing Ag, the conductive adhesive member corresponding to a conductive adhesive material.

In an embodiment, the method may further include molding the semiconductor chips mounted on the metal base with a sealing resin. In this case, the semiconductor chip mounted on the semiconductor device can be protected from impact, light, heat, and the like.

In an embodiment, a metal of the first metal layer may be NiCr, Ti or Ta. The above metals have wettability lower than that of Au or Cu with respect to Ag. Therefore, even if Ag contained in the conductive adhesive member provided on the entire surface of the back electrode is ionized, and silver ions move toward the negative electrode, the silver ions is not likely to reach the negative electrode by traveling along the side wall of the semiconductor chip.

In an embodiment, the forming the first metal layer may sequentially include continuously forming the first metal layer and the second metal layer by sputtering with respect to the entire back surface of the semiconductor substrate, forming the second metal layer by performing selective plating on a region excluding the region of the inside of the predetermined width of the scribe lines wherein the first metal layer and the second metal layer formed by the sputtering are regarded as a seed metal, and removing the second metal layer formed by the sputtering in the region of the inside of the width predetermined width of the scribe line. In this case, the second metal layer can be formed with good adhesion via the first metal layer on the back surface of the semiconductor substrate made of SiC. In addition, the first metal layer can be exposed in the region around the back surface of the semiconductor chip by removing the second metal layer in the region of the inside of the width predetermined width of the scribe lines.

In an embodiment, the forming the first metal layer may sequentially include continuously forming the first metal layer and the second metal layer by sputtering with respect to the entire back surface of the semiconductor substrate, forming the second metal layer by performing selective plating on a region excluding the region of the inside of the predetermined width of the scribe line wherein the first metal layer and the second metal layer formed by the sputtering are regarded as a seed metal, and further forming the first metal layer in the region of the inside of the predetermined width of the scribe lines. In this case, the second metal layer can be formed with good adhesion via the first metal layer on the back surface of the semiconductor substrate made of SiC. In addition, the first metal layer can be exposed in the region around the back surface of the semiconductor chip by forming the first metal layer in the region of the inside of the predetermined width of the scribe lines.

A semiconductor device according to an embodiment of the present disclosure includes a semiconductor chip in which a field effect transistor mainly composed of GaN is formed on the surface of a semiconductor substrate made of SiC. The semiconductor device includes a metal base on which a back surface of the semiconductor chip is mounted through a conductive adhesive member containing Ag, and a resin mold member configured to seal the semiconductor chip, wherein a metal having wettability lower than wettability of Au or Cu with respect to Ag is exposed in a region around the back surface of the semiconductor chip.

According to this semiconductor device, it is possible to suppress ion migration due to a conductive adhesive without hardening the surface of the conductive adhesive member containing Ag, the conductive adhesive member corresponding to a conductive adhesive material.

In an embodiment, a metal having wettability lower than that of Au or Cu with respect to Ag may be NiCr, Ti or Ta. The above metals have wettability lower than that of Au or Cu with respect to Ag. Therefore, even if Ag contained in the conductive adhesive member provided on the entire surface of the back electrode is ionized, and silver ions move toward the negative electrode, the silver ions is not likely to reach the negative electrode by traveling along the side wall of the semiconductor chip.

In an embodiment, the metal having lower wettability may be exposed at a width of 20 to 30 μm around the semiconductor chip. By setting the width of the metal having lower wettability to at least 20 to 30 μm, the migration of the conductive adhesive member containing Ag can be reliably suppressed.

A method of manufacturing a semiconductor device according to an embodiment of the present disclosure includes disposing an electrode pad along a scribe region on a main surface of a substrate, the substrate having, on the main surface, a plurality of device regions surrounded by the scribe region, forming a backside metal film, on a back surface of the substrate, spaced away from a first region in which the scribe region is projected on the back surface, forming a polyimide wall extending along an edge of the backside metal film on a second region between the first region and the backside metal film, and cutting the substrate along the scribe region to produce a plurality of semiconductor chips each including the device region.

In this manufacturing method, the backside metal film is provided, on the back surface, spaced away from the first region in which the scribe region is projected on the back surface. Further, a polyimide wall extending along the edge of the backside metal film is provided on the second region between the first region and the backside metal film. For example, when the backside metal film of the semiconductor chip is bonded to another member via the conductive bonding material, the growth of dendrite from the conductive bonding material is suppressed by the polyimide wall. Therefore, a short circuit between the backside metal film and the electrode pad due to the ion migration of the metal contained in the conductive bonding material can be reduced.

In an embodiment, the forming the polyimide wall may include forming the polyimide wall spaced apart from the first region, wherein the back surface of the substrate may be exposed between a side face of the substrate of each semiconductor chip and the polyimide wall of the semiconductor chip. In this case, a polyimide wall is reliably formed directly on the back surface of the substrate.

In an embodiment, a distance between the side face of the substrate and the polyimide wall may be at least 100 μm. Thus, even if a conductive bonding member such as a sintered metal type silver paste crawls up the polyimide wall, a distance of at least 100 μm to the electrode pad still exists. Therefore, the possibility of a short circuit between the backside metal film and the electrode pad is reduced.

In an embodiment, the width in the direction orthogonal to the extending direction of the polyimide wall may be in the range of 50 to 100 μm. In this case, the growth of dendrite from the conductive bonding material can be sufficiently suppressed.

In an embodiment, the semiconductor chip may be a field effect transistor, a planar shape of the semiconductor chip may be rectangular, a gate pad as the electrode pad may be disposed along one side of a pair of sides facing each other of the rectangle and a drain pad may be disposed along the other side of the pair of sides, and wherein the forming the polyimide wall may include forming the polyimide wall along at least the one side. By forming a polyimide wall along the side on which the gate pad is disposed, a short circuit between the gate pad and the backside metal film can be effectively reduced.

In an embodiment, the forming the polyimide wall may further include forming the polyimide wall along the other side. Although the ion migration does not occur on the drain pad side, since the conductive bonding member does not protrude from the transistor, another circuit component can be disposed in the closest proximity to the transistor. That is, the limitation of the mounting region based on the protrusion of the conductive bonding member can be reduced. In addition, by disposing other circuit components closest to the transistor, deterioration of high frequency characteristics can be suppressed.

In an embodiment, the forming the polyimide wall may further include forming the polyimide wall along the another pair of sides connected to the pair of sides of the rectangle. Thereby, the growth of dendrite in the vicinity of the another pair of sides can be suppressed, and the short circuit between the gate pad and the backside metal film can be more effectively reduced.

In an embodiment, the polyimide wall formed along the another pair of sides may have a discontinuity. For example, when forming a polyimide wall by screen printing, it is possible to support a mask located inside the polyimide wall.

In an embodiment, the method may further include mounting the semiconductor chip on a base having a metal surface using a conductive bonding material containing Ag.

A semiconductor device according to an embodiment of the present disclosure includes a substrate having a main surface including a device region, and a back surface, an electrode pad provided on the main surface along a side face of the substrate, a backside metal film provided, on the back surface, spaced away from the side face of the substrate, and a polyimide wall provided on the back surface between the side face of the substrate and the backside metal film and extending along an edge of the backside metal film. The semiconductor device according may further include a base, having a metal surface, on which the substrate is mounted, and a conductive bonding material containing Ag, the conductive bonding material being interposed between the backside metal film and the surface of the base.

Details of Embodiments of the Present Disclosure

Specific examples of a semiconductor device and a method of manufacturing the same according to an embodiment of the present disclosure will be described below with reference to the drawings. Note that the present disclosure is not limited to these exemplifications, is shown by the claims, and is intended to include all modifications within the meaning and scope equivalent to the claims. In addition, as long as combinations are possible for a plurality of embodiments, the present disclosure includes combinations of any of the embodiments. Note that in the description of the drawings, the same elements are denoted by the same reference numerals, and duplicate explanation is omitted.

(Semiconductor Device According to the First Embodiment)

Figure 1B:
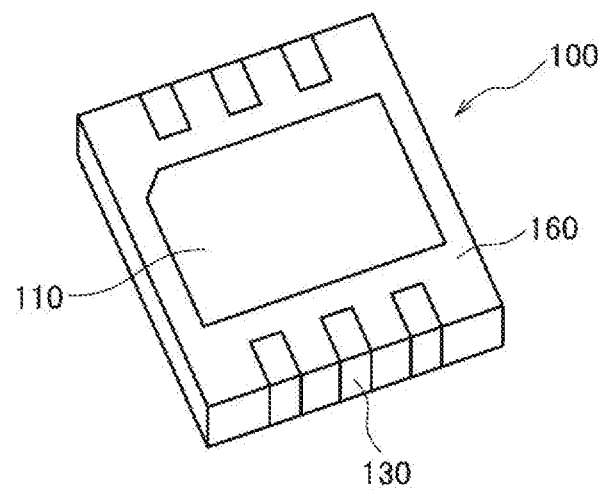
FIG. 1B is an external view of the semiconductor device shown in FIG. 1A as viewed from the back side (lower side)
Figure 2:
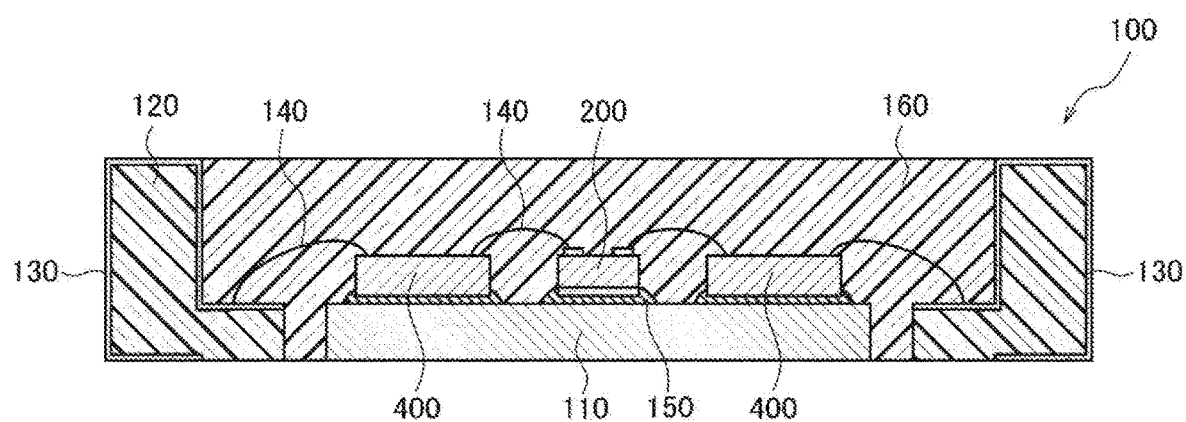
FIG. 2 is a cross-sectional view of the semiconductor device according to the first embodiment.

FIG. 1A is an external view of the semiconductor device according to the first embodiment as viewed from the front side (upper side), and FIG. 1B is an external view of the semiconductor device shown in FIG. 1A as viewed from the back side (lower side). FIG. 2 is a cross-sectional view of the semiconductor device according to the first embodiment. A semiconductor device 100 according to the first embodiment is provided with a chip carrier type package having a 6-pin electrode 130, and is composed of a resin package except for a metal base 110 on the bottom surface.

As shown in FIG. 2, the semiconductor device 100 includes the metal base 110, a semiconductor chip 200, and an input/output matching circuits 400. The semiconductor chip 200 and the input/output matching circuits 400 are mounted on the metal base 110 made of copper (Cu). The semiconductor chip 200 and the input/output matching circuits 400 are connected by a bonding wire 140. The semiconductor chip 200 and the input/output matching circuits 400 are mounted on the metal base 110 via a conductive adhesive member 150 (hereinafter referred to as "Ag-containing adhesive member") containing silver (Ag) as a conductive resin. As an Ag-containing adhesive member 150, a material in which Ag fillers are mixed in a resin, a silver solder containing Ag, Cu, and zinc (Zn) as a main component, or the like is used.

The semiconductor device 100 includes a side wall member 120 and an electrode 130. the resin side wall member 120 surrounding the metal base 110 is provided in the semiconductor device 100. The electrode 130 is formed on the outer surface of the side wall member 120. The electrode 130 is electrically connected to the wiring formed on the bottom of the inner surface of the side wall. More specifically, the electrode 130 on the outer surface is formed by plating the surface of a recess provided in the resin of the side wall member 120. Further, the wiring on the inner surface of the side wall and the input/output matching circuit 400 are also connected by the bonding wire 140. The inside surrounded by the side wall member 120 is filled with a resin 160, whereby the semiconductor chip 200 and the input/output matching circuit 400 are resin-sealed. Thus, the semiconductor chip 200 is molded by the sealing resin.

Figure 3:
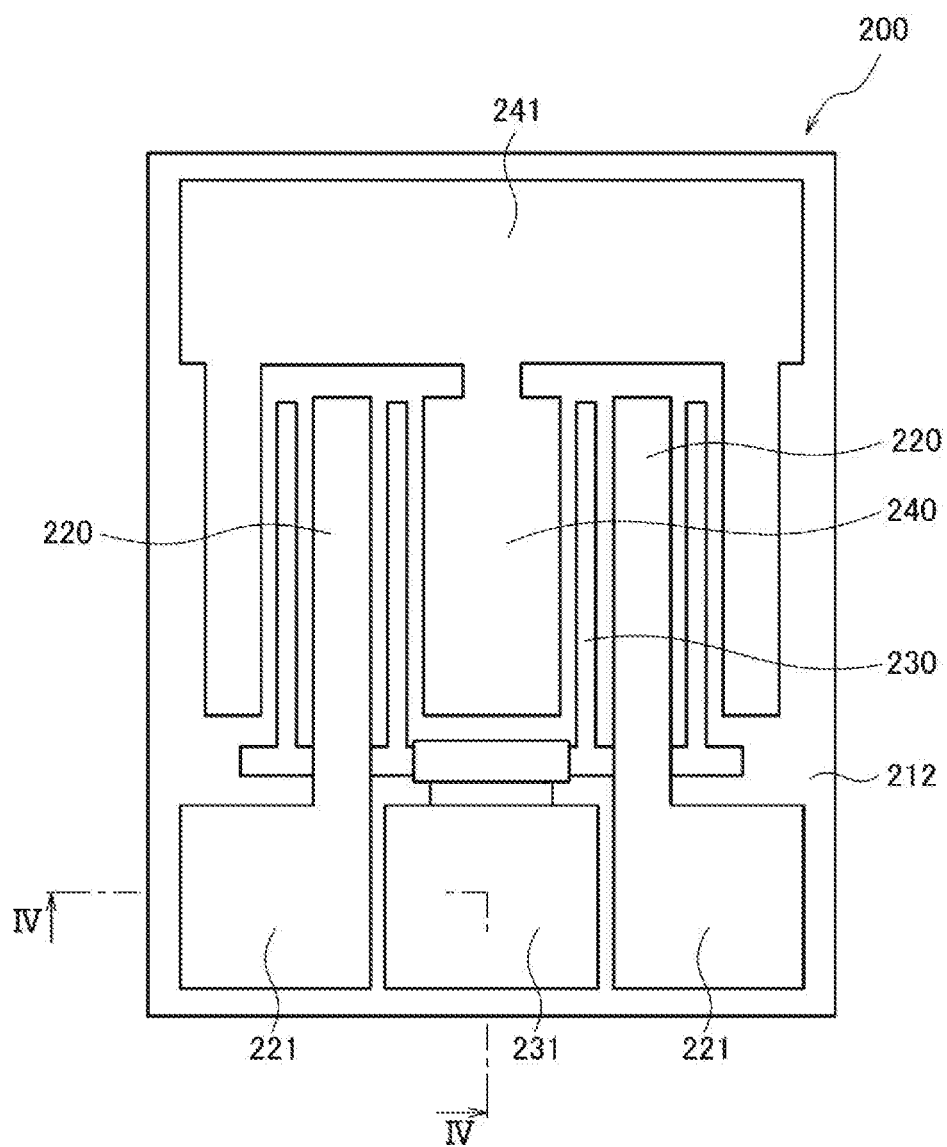
FIG. 3 is a plan view showing an example of a semiconductor chip mounted on the semiconductor device according to the first embodiment.

FIG. 3 is a plan view showing an example of a semiconductor chip mounted on the semiconductor device according to the first embodiment. The semiconductor chip 200 is an example of a field effect transistor (FET). For example, a GaN epitaxial layer 211 made of gallium nitride (GaN) is formed on the surface of a silicon carbide (SiC) substrate 201 to be described later, and the surface of the GaN epitaxial layer 211 is covered with an insulating layer 212. Further, a drain electrode 240 and a source electrode 220 are disposed with a finger-shaped gate electrode 230 included in the semiconductor chip 200 interposed therebetween. The drain electrode 240 gathers on a drain pad 241 in the upper part of FIG. 3. The source electrode 220 gathers on a source pad 221 in the lower part of FIG. 3. Furthermore, the gate electrode 230 gathers on a gate pad 231 in the lower part of FIG. 3. The source pad 221 is in contact with the GaN epitaxial layer 211 through an opening formed in an insulating film 212. The gate pad 231 and the drain pad 241 may be formed on the insulating film 211, or may be formed in contact with the GaN epitaxial layer 211 as with the source pad 221. In the GaN epitaxial layer 211, the peripheral region of the semiconductor chip 200 which does not overlap with the electrodes is inactivated.

In the first embodiment, two source pads 221 sandwich the gate pad 231 in the lower part of FIG. 3. In this example, the source electrodes 220 are individually coupled to the source pad 221, but the present disclosure is not limited thereto. For example, as a wire from the source electrode 220 to the source pad 221, a wire connected in common between the source electrode 220 and the source pad 221 may be provided. In addition, although the source pad 221 and the gate pad 231 are set to the same size, the present disclosure is not limited to this. From the viewpoint of reducing the gate capacitance, the source pad 221 may be set wide and the gate pad 231 may be set narrow.

In a high frequency device, from the viewpoint of reducing mirror capacitance between the gate and the drain and of performing high-speed switching, the drain electrode 240 and the gate electrode 230 is facing each other across the device active region (region where each electrode is located). In the planar arrangement of the semiconductor chip 200, the distance between the edge of the gate pad 231 and the edge of the semiconductor chip 200 is set to, for example, 50 to 70 μm.

Figure 4:
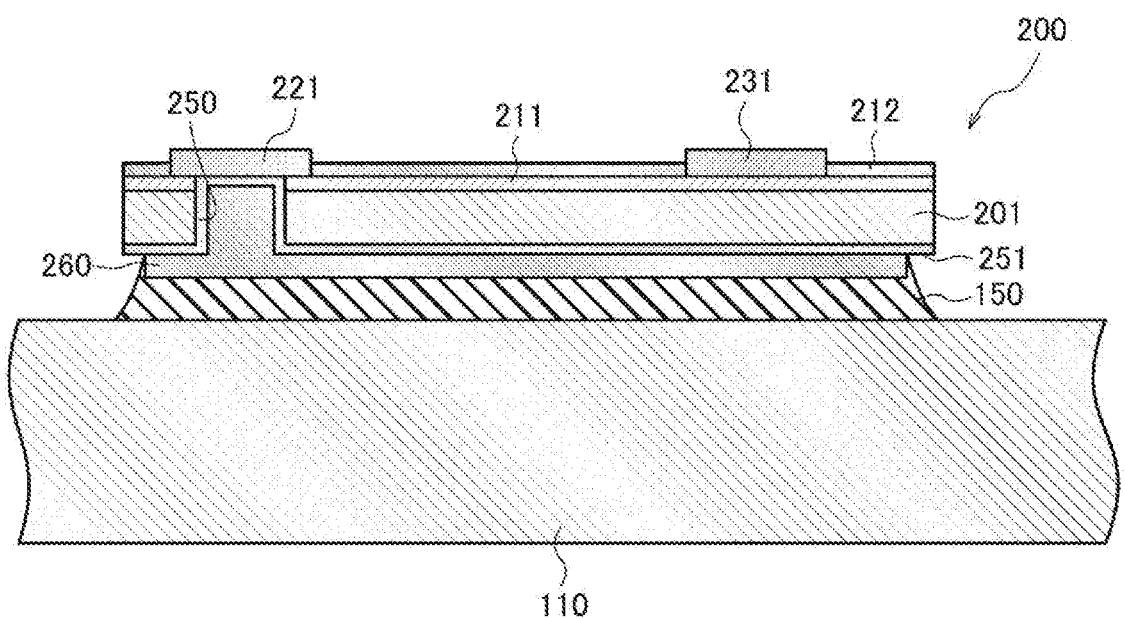
FIG. 4 is a cross-sectional view of the semiconductor chip mounting portion in the semiconductor device according to the first embodiment.

FIG. 4 is a cross-sectional view of the semiconductor chip mounting portion in the semiconductor device according to the first embodiment. FIG. 4 shows a cross section taken along line IV-IV of the semiconductor chip 200 shown in FIG. 3. In the semiconductor chip 200, as described above, the GaN epitaxial layer 211 is formed on the surface of an SiC substrate 201, and the source pad 221 and the gate pad 231 are formed on the surface of the GaN epitaxial layer 211. The structure shown in FIG. 4 is an example in which the gate pad 231 is formed in contact with the GaN epitaxial layer 211. The source pad 221 is electrically connected to a back electrode 260 made of Au (gold) formed on substantially the entire back surface of semiconductor chip 200 through a via 250 formed in the SiC substrate 201. In the semiconductor chip 200, the entire back electrode 260 is die-bonded on the metal base 110 through the Ag-containing adhesive member 150.

The majority of conventional semiconductor chips including those for high frequency use are devices mainly made of gallium arsenide (GaAs). In addition, a laterally diffused metal oxide semiconductor (Si-LDMOS) is also partially used as a high frequency device. The maximum value of the bias voltage applied to the gate (the maximum value of the negative bias with respect to the source potential) is generally a minus few volts from the viewpoint of the withstand voltage of the semiconductor chip whether it is made of GaAs or silicon (Si). However, as the application of the wide gap GaN-based material as shown in the first embodiment is promoted as the semiconductor material, the negative maximum value of the gate bias may be set large.

Here, the resin package has little effect of suppressing entry of moisture into the package. For this reason, the presence of the resin package may be hardly considered in terms of the water blocking ability in the semiconductor device field. As a result, Ag contained as a filler in the bonding resin tends to react with moisture to accelerate ionization ($Ag^+$). When a negative bias is applied to the gate, ionized silver ions $Ag^+$ in the bonding resin may crawl up the side face of the semiconductor chip 200 toward the gate pad 231, and may reach the gate pad 231. That is, so-called ion migration occurs.

In order to cope with this, in the first embodiment, a metal having wettability lower than that of Au or Cu with respect to Ag is exposed in the region around the back surface of the semiconductor chip 200. Nickel chromium (NiCr), titanium (Ti), and tantalum (Ta) are known as a metal having wettability lower than that of Au or Cu with respect to Ag. In the example shown in FIG. 4, an NiCr layer 251 is formed between the SiC substrate 201 and the back electrode 260. In addition, instead of the Au that forms the back electrode 260, the NiCr layer 25 overhangs back electrode 260 so that it is exposed in the region around the back surface of the semiconductor chip 200. The region around the back surface of the semiconductor chip 200 corresponds to a region located at the edge of the back surface and in the vicinity thereof.

As a result, the Ag-containing adhesive member 150 adheres closely to the Au forming the back electrode 260, but tends to be repelled by an NiCr layer 251. Therefore, the Ag-containing adhesive member 150 is unlikely to be present in the region around the back surface of the semiconductor chip 200. The ionized silver ions $Ag^+$ in the Ag-containing adhesive member 150 is not likely to crawl up the side face of the semiconductor chip 200 toward the gate pad 231. This is because $Ag^+$ does not easily move on the surface of NiCr layer 251 due to the low wettability between $Ag^+$ and NiCr. Thus, the migration can be suppressed. The NiCr layer 251 formed on the region around the back surface of the semiconductor chip 200 may be exposed with a width of 20 to 30 µm from the viewpoint of reliably suppressing the migration.

(Method of Manufacturing Semiconductor Device According to First Embodiment)

Figure 5:
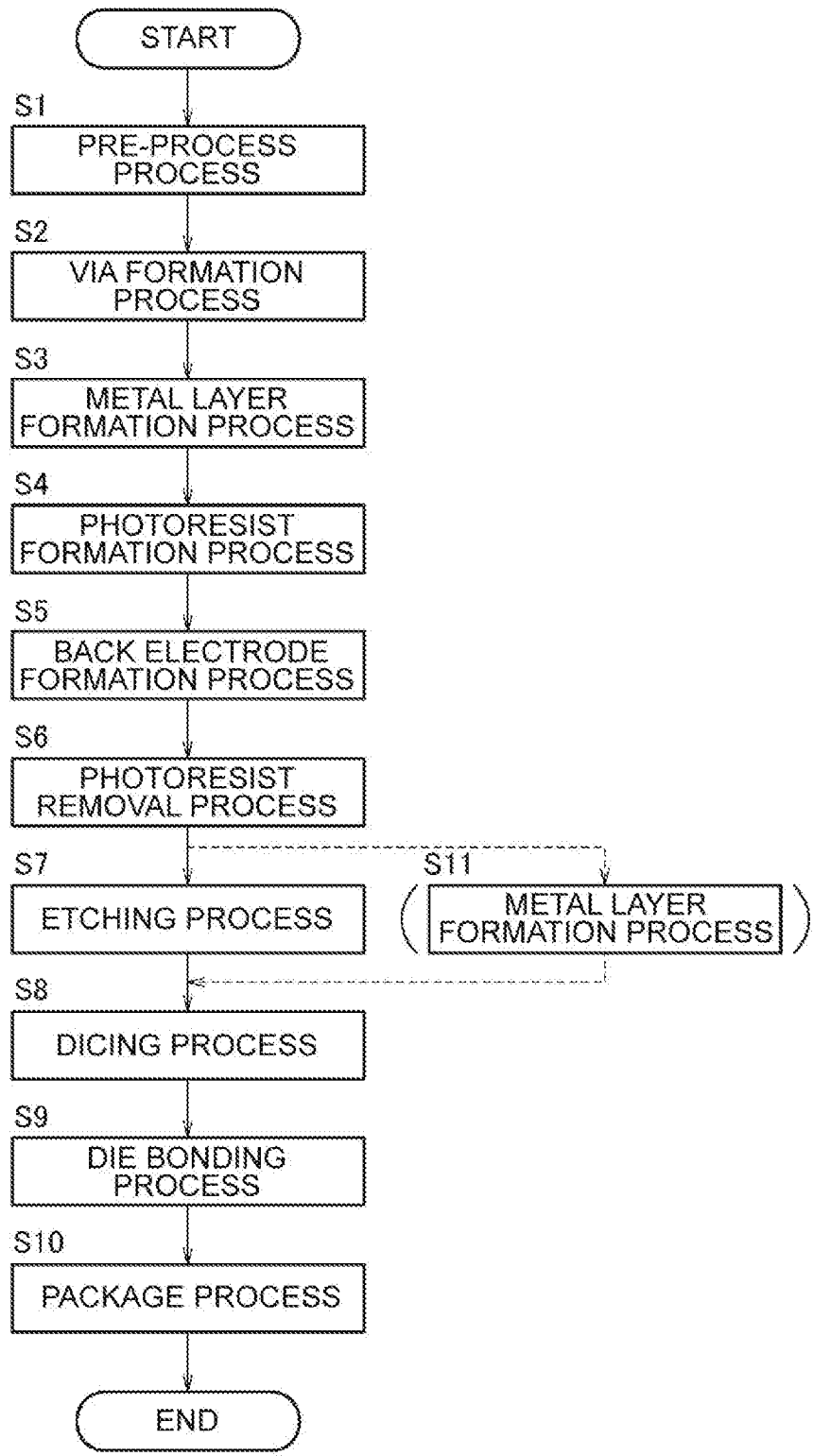
FIG. 5 is a diagram showing a manufacturing flow of the semiconductor device according to the first embodiment.
Figure 6A:
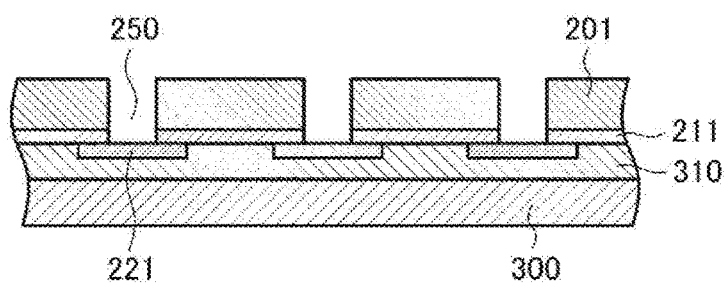
FIGS. 6A to 6H are diagrams for explaining respective steps in the manufacturing flow of the semiconductor device according to the first embodiment.
Figure 6B:
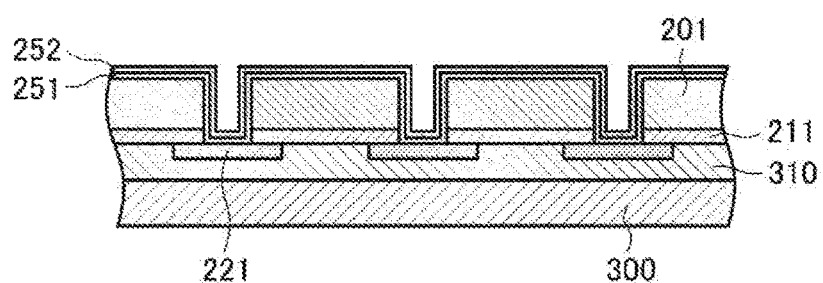
Figure 6C:
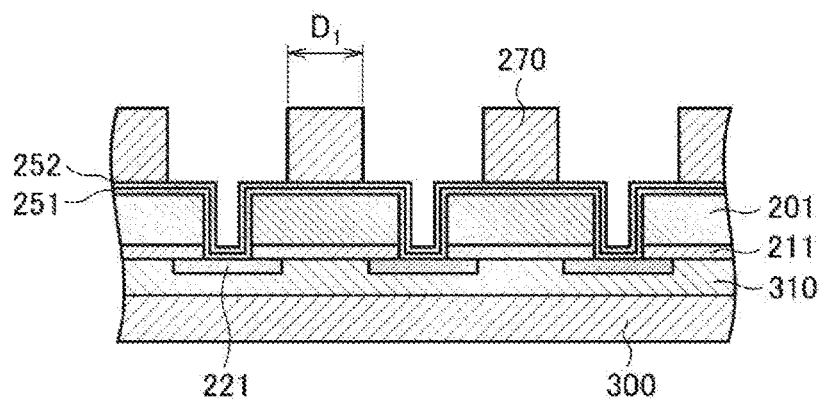
Figure 6D:
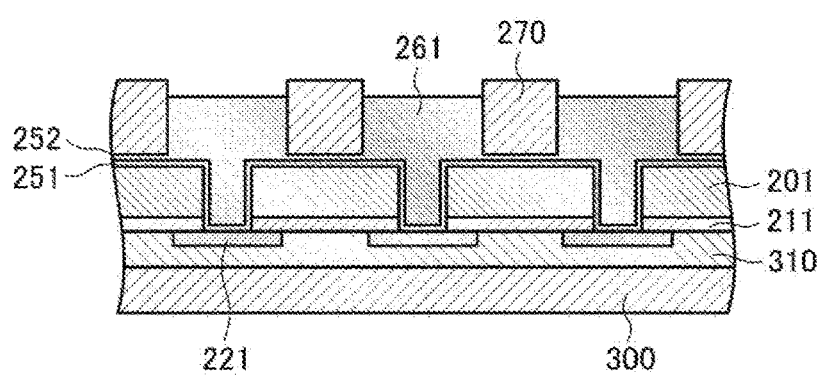
Figure 6E:
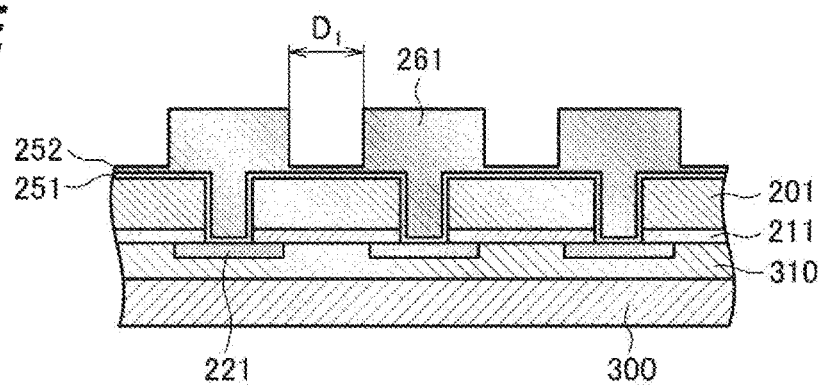
Figure 6F:
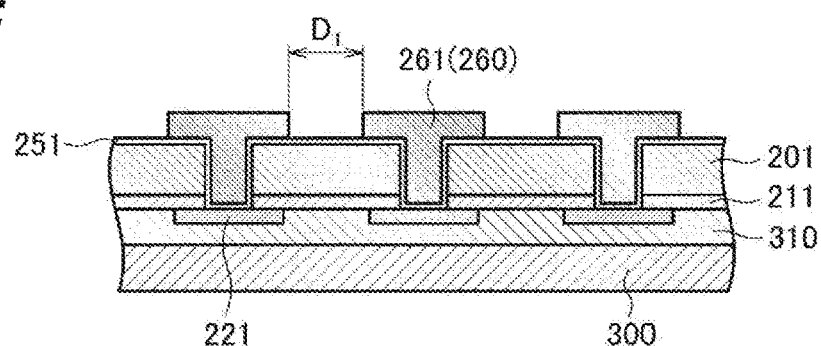
Figure 6G:
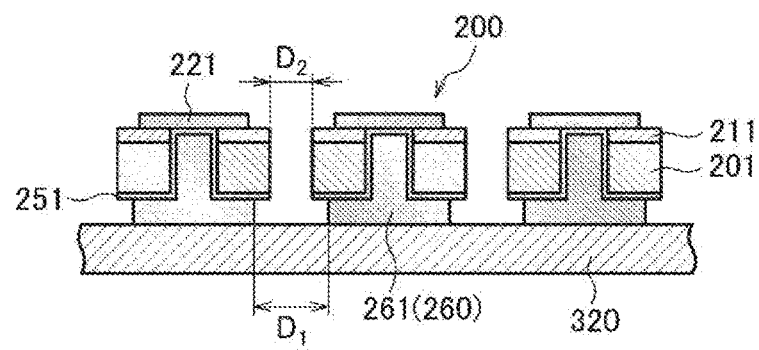

Next, a method of manufacturing the semiconductor device according to the first embodiment will be described. FIG. 5 is a diagram showing a manufacturing flow of the semiconductor device according to the first embodiment, and FIGS. 6A to 6H are diagrams for explaining respective steps in the manufacturing flow of the semiconductor device according to the first embodiment. FIG. 6A shows a via formation process, FIG. 6B shows a metal layer formation process, FIG. 6C shows a photoresist formation process, FIG. 6D shows a back electrode formation process, FIG. 6E shows a photoresist removal process, FIG. 6F shows an etching process, FIG. 6G shows a dicing process, and FIG. 6H respectively show a die bonding process. Note that, in these drawings, only a portion around the source pad 221 of the semiconductor chip 200 is schematically shown for simplification.

(Pre-Process Process)

First, the GaN epitaxial layer 211 is formed on the surface of the SiC substrate 201 in the pre-process process of step S1. Subsequently, an FET to be a plurality of semiconductor chips 200 is manufactured on the GaN epitaxial layer 211. As shown in FIG. 3, the source region and the drain region are formed in the GaN epitaxial layer 211 by doping. Subsequently, the insulating layer 212, the source electrode 220, the drain electrode 240, and the gate electrode 230 are provided on the surface of the GaN epitaxial layer 211. The electrodes are respectively connected to the source pad 221, the drain pad 241, and the gate pad 231. As a result, the FET is manufactured. Each of the plurality of semiconductor chips is partitioned by a scribe line having a predetermined width.

(Via Formation Process)

Next, in step S2, as shown in FIG. 6A, a wafer where a plurality of FETs is formed is provided on a glass support substrate 300. For example, the FET formation surface, that is, the GaN epitaxial layer 211 side, is attached on the glass support substrate 300 through an adhesive 310. Thereafter, the SiC substrate 201 is ground to thin the wafer thickness to about 100 µm. After grinding, the via 250 is formed from the back side of the wafer toward the source pad 221. Respective electrodes or pads of the FET are formed on the GaN epitaxial layer 211 in the wafer. The metal of the source pad 221 functions as a stopper layer when etching the SiC substrate 201 and the GaN epitaxial layer 211 to form the via 250.

(Metal Layer Formation Process)

Next, in step S3, as shown in FIG. 6B, after the via 250 is formed in the SiC substrate 201, the NiCr layer 251 and an Au layer 252 are formed on the entire back surface of the SiC substrate 201 by sputtering. The thickness of the NiCr layer 251 is, for example, about 100 nm, and the thickness of the Au layer 252 is also, for example, about 100 nm. The NiCr layer 251 corresponds to a first metal layer having wettability lower than that of Au or Cu with respect to Ag in the present disclosure.

(Photoresist Formation Process)

Next, in step S4, as shown in FIG. 6C, a photoresist 270 having a pattern covering the scribe lines is formed on the Au layer 252. The photoresist 270 is not provided in the via 250 formed in the previous step. The thickness of the photoresist 270 is set in accordance with the thickness of Au by plating in the next step. Here, the scribe line is a line that divides the region of the semiconductor chip formed on the wafer. By providing the scribe line, a predetermined width is provided between the adjacent semiconductor chips. In the present disclosure, this width is referred to as the scribe line width. In the first embodiment, the width of the scribe line is indicated by the width $D_1$ in FIG. 6C. The width of the photoresist 270 is equal to the width $D_1$ of this scribe line. For this reason, the photoresist 270 is formed in a grid shape with a width $D_1$ on the back surface of the wafer.

(Back Electrode Formation Process)

Next, in step S5, as shown in FIG. 6D, an Au layer 261 is formed by selective electrolytic plating on a region not covered with the photoresist 270 wherein the NiCr layer 251 and the Au layer 252 formed by sputtering are regarded as a seed metal. In this case, the Au layer 261 is also formed in the via 250 exposed to the photoresist 270. The Au layer 261 functions as the back electrode 260 to be described later. The Au layer 261 corresponds to a second metal layer in the present disclosure.

(Photoresist Removal Process)

Next, in step S6, as shown in FIG. 6E, the Au layer 261 is formed on the back surface of the SiC substrate 201 by electrolytic selection plating, and then the photoresist 270 is removed. The photoresist 270 is provided with a width $D_1$ of the scribe line of the semiconductor chip 200. Therefore, after step S6, a rectangular island of the thick Au layer 261 formed by plating and a lattice of the thin Au layer 252 formed by sputtering appear on the back surface of the SiC substrate 201 from which the photoresist 270 has been removed. The width of the grid is width $D_1$.

(Etching Process)

Next, in step S7, as shown in FIG. 6F, the Au layer 252 and the Au layer 261 on the back surface of the SiC substrate 201 are removed by wet etching using the KI solution (potassium iodide solution) as an etchant. In this case, the Au layer 252 formed as a seed metal is completely removed because it is extremely thinner than the Au layer 261 formed by plating. Thus, the NiCr layer 251 located below the Au layer 252 is exposed in a lattice of width $D_1$. Further, the Au layer 261 formed by plating is also etched to have a predetermined thickness.

(Dicing Process)

Next, the wafer subjected to the process shown in FIG. 6F is removed from the glass support substrate 300, and the back surface of the SiC substrate 201 is cleaned. An expanding tape 320 is attached to the back surface of the SiC substrate 201. Since the back electrode 260 made of the Au layer 261 is formed on substantially the entire back surface of the SiC substrate 201, the expanding tape 320 is attached to the back electrode 260. Thereafter, in step S8, dicing is performed as shown in FIG. 6G to obtain individual semiconductor chips 200. Here, the dicing is performed using a dicing blade having a width $D_2$ narrower than the width $D_1$ of the scribe line, for example, within the width $D_1$ of the scribe line, along the scribe line. Thus, the back electrode 260 made of Au does not exist in the width $D_1$ of the scribe line on the back surface of the SiC substrate 201, and the NiCr layer 251 is exposed. When the dicing with a laser is performed, the dicing is performed with a width $D_2$ narrower than the width $D_1$ of the scribe line. In the first embodiment, the width $D_1$ of the scribe line and the width $D_2$ of dicing are determined such that the width of the remaining NiCr layer 251 is, for example, 20 to 30 µm. The width of the remaining NiCr layer 251 corresponds to $(D_1-D_2)/2$.

(Die Bonding Process)

Figure 6H:
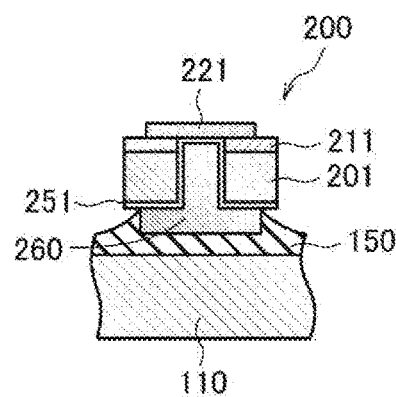

Next, in step S9, as shown in FIG. 6H, the semiconductor chip 200 is separated from the expanding tape 320, whereby the semiconductor chip 200 is individualized. Further, the individual semiconductor chips 200 are die-bonded onto the metal base 110 using the Ag-containing adhesive member 150. The NiCr layer 251 is exposed at a width of 20 to 30 µm in the region around the back surface of the semiconductor chip 200. Therefore, even if the semiconductor chip 200 is die-bonded with the Ag-containing adhesive member 150, the Ag-containing adhesive member 150 does not spread in the region where the NiCr layer 251 is exposed on the semiconductor chip 200, and the NiCr layer 251 is likely to be kept exposed. Therefore, it is suppressed that $Ag^+$ crawls up the side face of the semiconductor chip 200.

(Package Process)

After the above processes, in step S10, as shown in FIG. 2, the input/output matching circuits 400 are die-bonded on the metal base 110. The semiconductor chip 200 and the input/output matching circuits 400 are connected by the bonding wires 140. Furthermore, resin-sealing is performed using the resin side wall member 120 and the resin 160. Thus, the packaged semiconductor device 100 is obtained.

(Semiconductor Device and Method of Manufacturing the Same in the Second Embodiment)

Figure 7A:
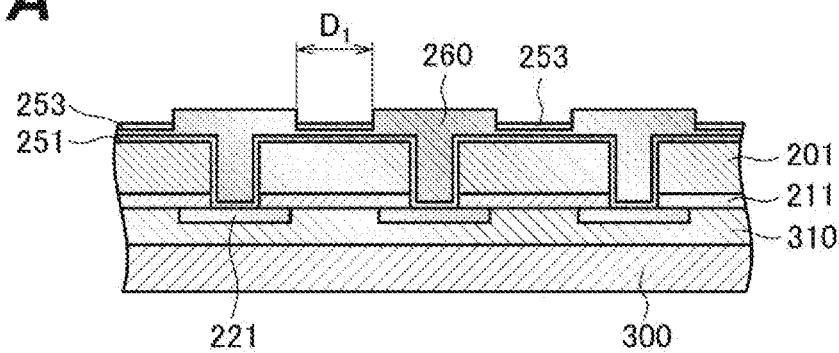
FIGS. 7A to 7C are diagrams for explaining respective steps in the manufacturing flow of the semiconductor device according to a second embodiment.
Figure 7B:
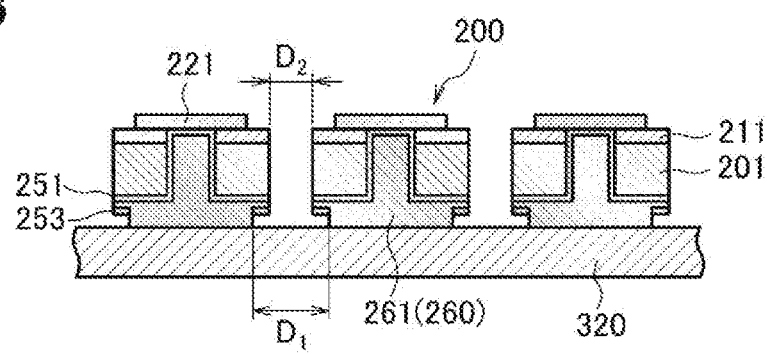
Figure 7C:
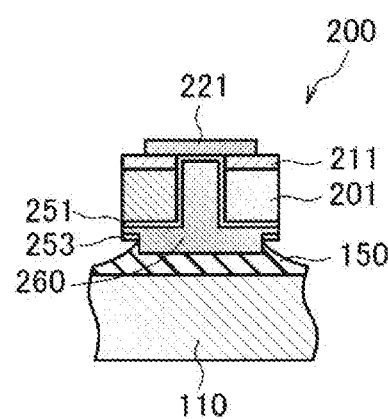

Next, a semiconductor device according to the second embodiment and a method of manufacturing the same will be described. FIGS. 7A to 7C are diagrams for explaining respective steps in the manufacturing flow of the semiconductor device according to the second embodiment, and FIG. 7A shows a metal layer formation process, FIG. 7B shows a dicing process, and FIG. 7C shows a bonding process. The semiconductor manufacturing method according to the second embodiment is obtained by replacing the etching process of step S7 with the metal layer formation process of step S11 in the manufacturing flow of the semiconductor device according to the first embodiment shown in FIG. 5. Therefore, the manufacturing method of the second embodiment sequentially includes steps S1 to S6, step S11, and steps S8 to S10 shown in FIG. 5.

(Metal Layer Formation Process)

In the method of manufacturing the semiconductor device according to the second embodiment, after completion of the photoresist removal process shown in step S6 of FIG. 5, the Au layer 252 formed by sputtering is not removed from the state shown in FIG. 6E. Instead, as shown in FIG. 7A, an NiCr layer 253 is further formed on the Au layer 252 within the width $D_1$ of the scribe line. As a result, the region within the width $D_1$ of the scribe line has a three-layer metal configuration of the NiCr layer 251, the Au layer 252, and the NiCr layer 253 in the order from the SiC substrate 201 side.

(Dicing Process)

A method of forming the NiCr layer 253 within the width $D_1$ of the scribe line includes, for example, the following method. First, an NiCr layer with a thickness of about 100 nm is formed on the entire back surface of the SiC substrate 201 by sputtering. Next, a photoresist covering about 10 µm around the width $D_1$ of the scribe line and the width direction thereof is formed by patterning. The exposed NiCr layer is removed by reactive ion etching or trimming using a chlorine-based gas as a reaction gas. Thus, the Au layer 261 in the region corresponding to the back electrode 260 can be exposed, and the NiCr layer 253 can be left within the width $D_1$ of the scribe line. In the manufacturing method according to the second embodiment, the plated Au layer 261 is not etched. Therefore, the thickness of the Au layer 261 may be set to a predetermined thickness in the back electrode formation process of step S5 in advance.

(Die Bonding Process)

Next, the wafer subjected to the process shown in FIG. 7A is removed from the glass support substrate 300, and the back surface of the SiC substrate 201 is cleaned. Thereafter, the expanding tape 320 is attached. The back electrode 260 made of the Au layer 261 is formed on substantially the entire back surface of the SiC substrate 201. For this reason, the expanding tape 320 is attached to the back electrode 260. Thereafter, in step S8, the dicing is performed as shown in FIG. 7B to obtain individual semiconductor chips 200. Here, the dicing is performed using a dicing blade having a width $D_2$ narrower than the width $D_1$ of the scribe line along the scribe line. Thus, the NiCr layer 253 is exposed in the width D1 of the scribe line on the back surface of the SiC substrate 201.

Next, in step S9, as shown in FIG. 7C, the semiconductor chip 200 is separated from the expanding tape 320, whereby the semiconductor chip 200 is individualized. Further, the individual semiconductor chips 200 are die-bonded onto the metal base 110 using the Ag-containing adhesive member 150. The NiCr layer 253 is exposed at a width of 20 to 30 µm in the region around the back surface of the semiconductor chip 200. Therefore, even if the semiconductor chip 200 is die-bonded with the Ag-containing adhesive member 150, the Ag-containing adhesive member 150 does not spread in the region where the NiCr layer 253 is exposed in the semiconductor chip 200, and the NiCr layer 253 is likely to be kept exposed. Therefore, it is suppressed that $Ag^+$ crawls up the side face of the semiconductor chip 200. The subsequent package process is the same as the method of manufacturing the semiconductor device according to the first embodiment.

Third Embodiment

Figure 8:
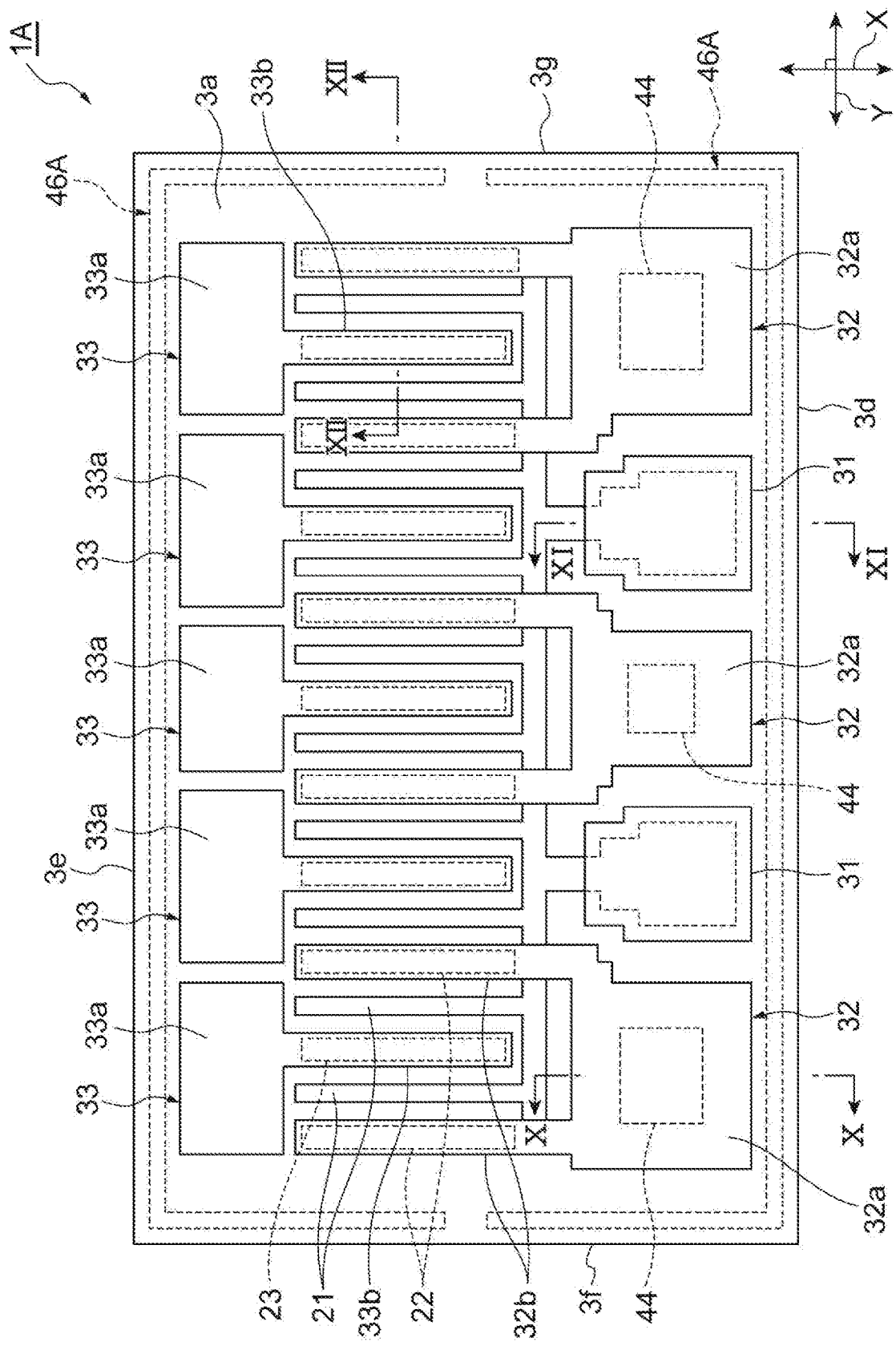
FIG. 8 is a plan view showing the configuration of a transistor 1A as an example of a semiconductor device according to a third embodiment.
Figure 9:
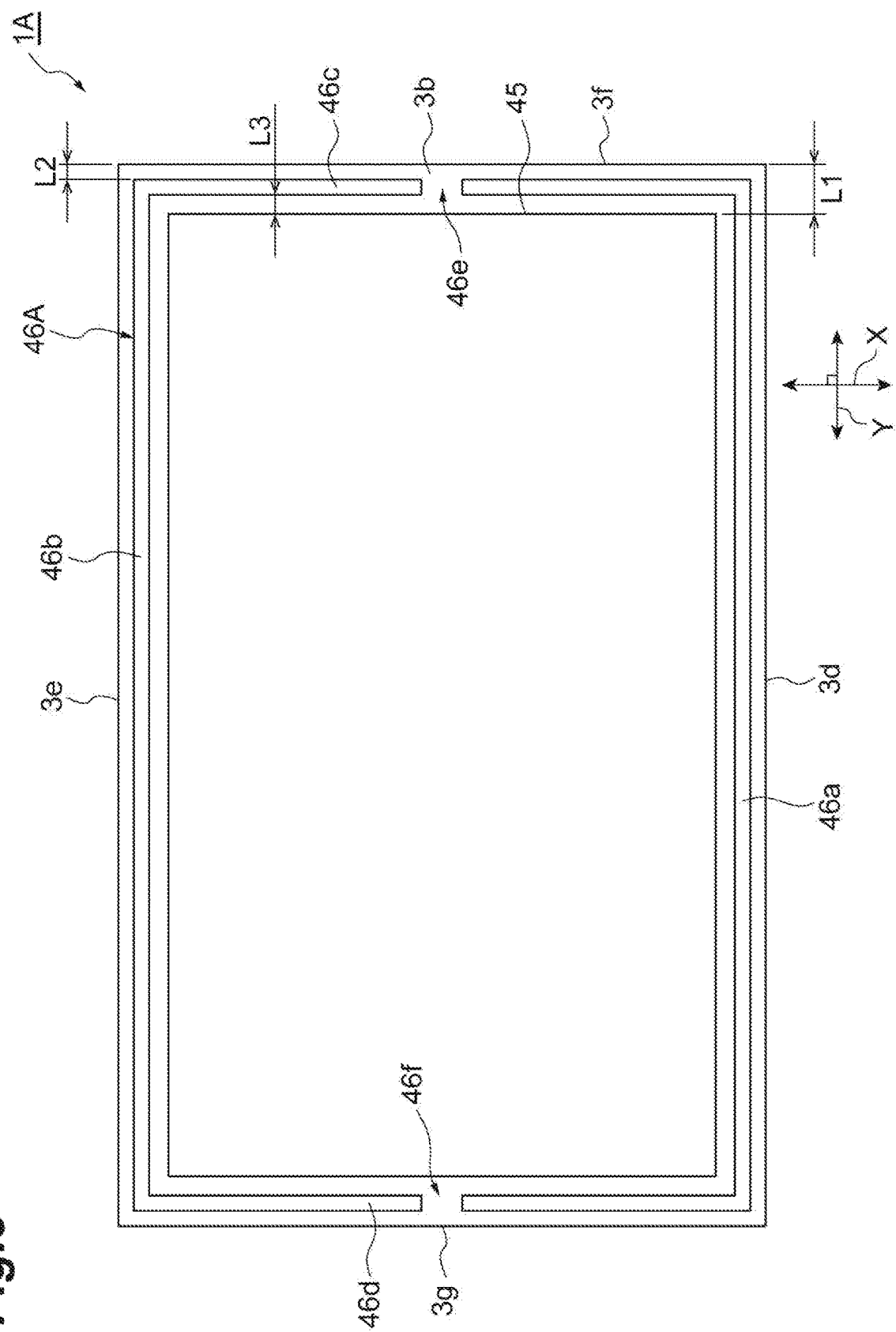
FIG. 9 is a bottom view of the transistor 1A.
Figure 10:
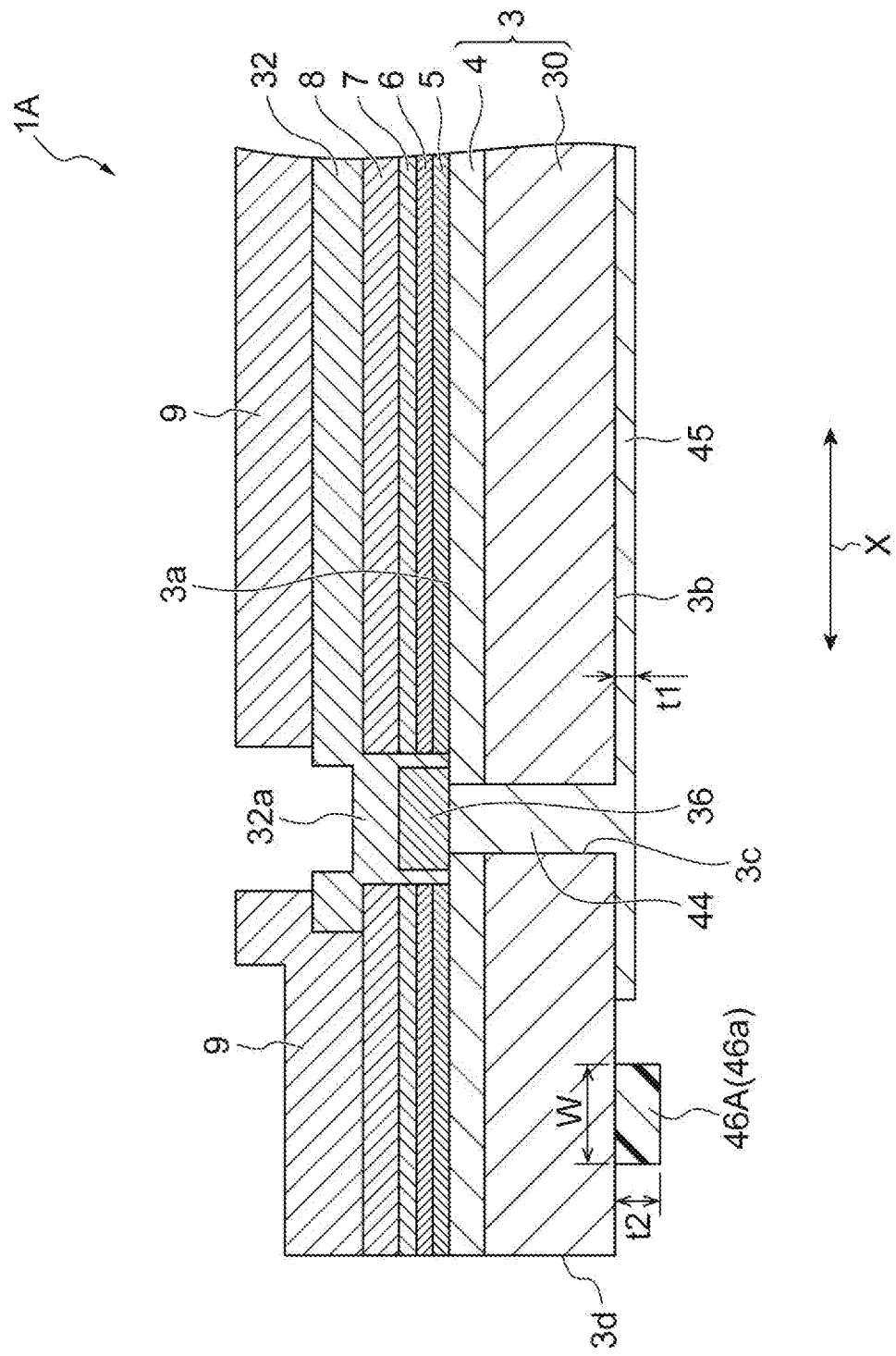
FIG. 10 is a cross-sectional view taken along line X-X in FIG. 8.
Figure 11:
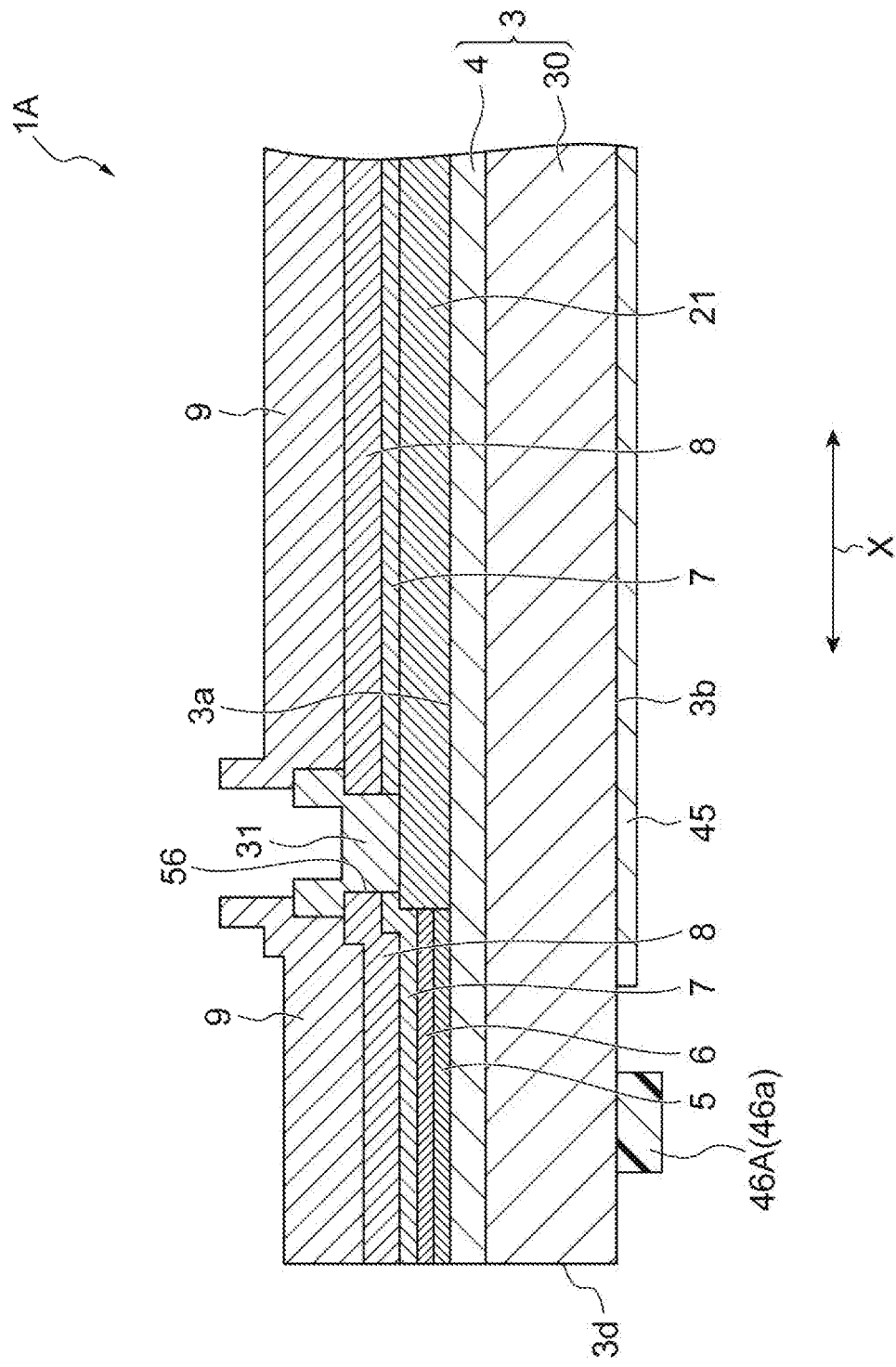
FIG. 11 is a cross-sectional view taken along line XI-XI of FIG. 8.
Figure 12:
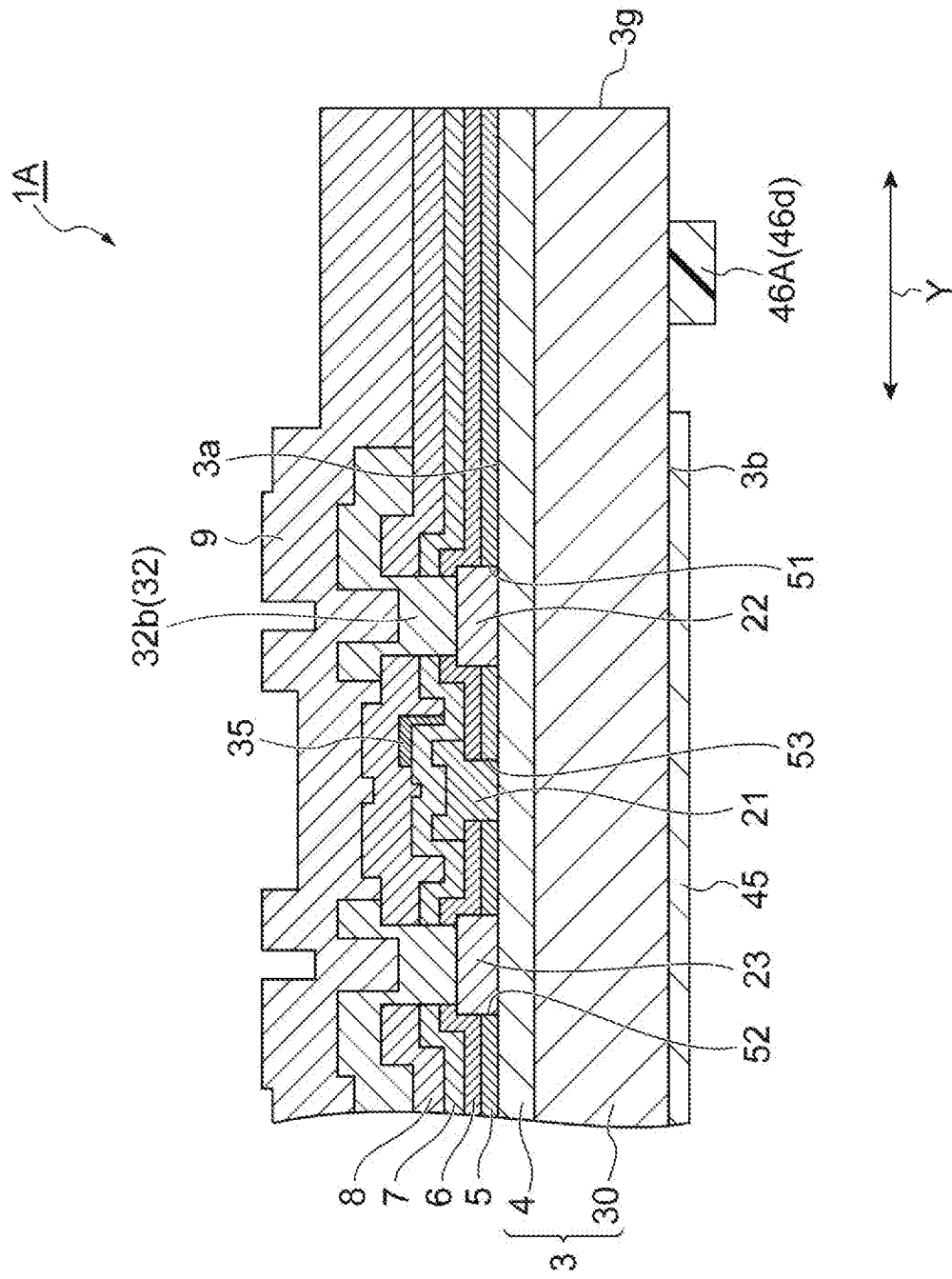
FIG. 12 is a cross-sectional view taken along line XII-XII of FIG. 8.

FIG. 8 is a plan view showing a configuration of a field effect transistor (hereinafter simply referred to as a transistor) 1A as an example of the semiconductor device according to the third embodiment. FIG. 9 is a bottom view of a transistor 1A. FIG. 10 is a cross-sectional view taken along line X-X in FIG. 8. FIG. 11 is a cross-sectional view taken along line XI-XI of FIG. 8. FIG. 12 is a cross-sectional view taken along line XII-XII of FIG. 8. As shown in these figures, the transistor 1A includes the substrate 3, insulating films 5 to 9, a gate electrode 21, a source electrode 22, a drain electrode 23, a gate pad 31, a source wiring 32, a drain wiring 33, a field plate 35 (see FIG. 12), a metal via 44 (see FIG. 10), a backside metal film 45, and a polyimide wall 46A. In FIG. 8, the insulating films 5 to 9 are not shown.

The substrate 3 is a plate-like member having a rectangular planar shape, and has a flat main surface 3a and a flat back surface 3b opposite the main surface 3a. Further, the substrate 3 has a pair of side faces 3d and 3e and a pair of side faces 3f and 3g. The pair of side faces 3d and 3e g is facing each other in any direction X along the main surface 3a, and extend along the direction Y intersecting (for example, orthogonal to) the direction X. Further, the pair of side faces 3f and 3g is facing each other in the direction Y, and connects the pair of side faces 3d and 3e extend along the direction X. The pair of side faces 3d and 3e form a pair of sides of the rectangular substrate 3 when viewed in the normal direction of the main surface 3a, and the pair of side faces 3f and 3g forms the another pair of sides of the rectangular substrate 3 connecting the pair of sides.

The substrate 3 includes a growth substrate 30 and a nitride semiconductor layer 4 formed on the growth substrate 30. The growth substrate 30 is, for example, an SiC substrate, and includes the back surface 3b. The growth substrate 30 is used for epitaxial growth of the nitride semiconductor layer 4.

The nitride semiconductor layer 4 is an epitaxial layer formed on the growth substrate 30. The nitride semiconductor layer 4 constitutes the main surface 3a of the substrate 3. When the transistor 1A is a high electron mobility transistor (HEMT), the nitride semiconductor layer 4 includes, for example, an AlN buffer layer in contact with the main surface 3a, a GaN channel layer provided on the AlN buffer layer, an AlGaN (or InAlN) barrier layer provided the GaN channel layer, and a GaN cap layer provided on the barrier layer. The AlN buffer layer is undoped, and its thickness is, for example, in the range of 10 to 20 nm. The GaN channel layer is undoped, and its thickness is, for example, in the range of 0.4 to 1.2 μm. The thickness of the barrier layer is, for example, in the range of 10 to 30 nm. However, in the case of the InAlN barrier layer, the thickness is set smaller than 20 nm. The GaN cap layer is n-type, and its thickness is, for example, 5 nm.

The insulating films 5 to 9 constitute an insulating laminated structure located on the nitride semiconductor layer 4. The insulating films 5 to 9 are provided over substantially the entire surface of the main surface 3a. The insulating films 5 to 9 mainly contain silicon compounds such as SiN, $SiO_2$ and SiON. In the third embodiment, the insulating films 5 to 9 are in contact with each other, but another layer may be provided between at least one set of two layers.

A plurality of source electrodes 22 is provided on the nitride semiconductor layer 4 and make an ohmic contact with the nitride semiconductor layer 4 through a source opening 51 (see FIG. 12) formed in the insulating film 5. As shown in FIG. 8, the plurality of source electrodes 22 is disposed along the direction Y, and the planar shape of each source electrode 22 has a rectangular shape in which the direction X is the longitudinal direction. The source electrode 22 is formed in which a laminated structure including, for example, a Ti layer, an Al layer, and a Ti layer (or a Ta layer, an Al layer, and a Ta layer) are alloyed, and mainly includes Al.

A plurality of drain electrodes 23 is provided on the nitride semiconductor layer 4 and is in ohmic contact with the nitride semiconductor layer 4 through a drain opening 52 (see FIG. 12) formed in the insulating film 5. As shown in FIG. 8, the plurality of drain electrodes 23 is alternately aligned with the source electrodes 22 in the direction Y, and the planar shape of each drain electrode 23 has a rectangular shape in which the direction X is the longitudinal direction. The drain electrode 23 is also formed in which a laminated structure including, for example, a Ti layer, an Al layer, and a Ti layer (or a Ta layer, an Al layer, and a Ta layer) are alloyed, and mainly includes Al.

The gate electrode 21 includes a plurality of portions (finger portion) provided on the nitride semiconductor layer 4 and a portion extending from the finger portion toward one side face 3d of substrate 3. The finger portion of each gate electrode 21 extends in the direction X, and is located between the source electrode 22 and the drain electrode 23. The finger portion of the gate electrode 21 is in Schottky contact with the nitride semiconductor layer 4 through a gate opening 53 (see FIG. 12) formed in the insulating film 5. The contact width (gate length) in the direction Y between the gate electrode 21 and the nitride semiconductor layer 4 is, for example, 0.5 μm. The gate electrode 21 has a laminated structure including a Ni layer and an Au layer on the Ni layer. In one example, the Ni layer is in contact with the nitride semiconductor layer 4 and the Au layer is in contact with the Ni layer. Alternatively, a Pd layer may be interposed between the Ni layer and the Au layer.

The field plate 35 is a metal film provided along the gate electrode 21. As shown in FIG. 12, the insulating film 7 is interposed between the field plate 35 and the gate electrode 21. The field plate 35 has, for example, a laminated structure of a Ti layer (or a Ta layer) and an Au layer.

The gate pad 31 is an example of an electrode pad in the third embodiment. The gate pad 31 is a metal film provided on a portion of the gate electrode 21 where is close to the side face 3d. The gate pad 31 is electrically connected with the gate electrode 21 with a low resistance since the gate pad 31 comes into contact with the gate electrode 21 through an opening 56 (see FIG. 11) formed in the insulating films 7 and 8. In the third embodiment, a plurality of gate pads 31 is provided in the direction Y along the side face 3d of the substrate 3. Each gate pad 31 is electrically connected to an external wiring through a bonding wire. Therefore, as shown in FIG. 11, the surface of each gate pad 31 is exposed from the opening of the insulating film 9. Each gate pad 31 has a laminated structure including, for example, a TiW layer and an Au layer on the TiW layer.

The source wiring 32 is a metal film provided on the nitride semiconductor layer 4. The source wiring 32 includes a plurality of portions (pad portion) 32a provided alternately side by side with the plurality of gate pads 31 along the side face 3d and portions (finger portion) 32b which extends on and covers the respective source electrodes 22. The source wiring 32 is electrically connected to each source electrode 22 with low resistance since each source electrode 22 is in contact with the finger portion 32b. Also, as shown in FIG. 10, a pad portion 32a of the source wiring 32 provided side by side with the gate pad 31 is exposed from the opening of the insulating film 9, and is electrically connected to the backside metal film 45 through the metal via 44 penetrating the substrate 3. The pad portion 32a of the source wiring 32 of the third embodiment includes a lower layer 36 in contact with the nitride semiconductor layer 4. The lower layer 36 is used to stop the etching when forming, in the substrate 3, a through hole 3c for forming the metal via 44. The lower layer 36 has, for example, the same laminated structure as the gate electrode 21. The remainder of each source wiring 32 except the lower layer 36 has a laminated structure similar to that of the gate pad 31, for example, the laminated structure including a TiW layer and an Au layer on the TiW layer. The laminated structure is in contact with the nitride semiconductor layer 4 around the lower layer 36.

The metal via 44 is wiring provided in the through hole 3c penetrating the substrate 3 (the growth substrate 30 and the nitride semiconductor layer 4) from the back surface 3b to the main surface 3a. The metal via 44 extends from the back surface 3b of the substrate 3 to the lower layer 36 of the source wiring 32 and is in contact with the lower layer 36. The metal via 44 is provided to electrically connect the backside metal film 45 provided on the back surface 3b and the source electrode 22 with a low resistance via the source wiring 32. When the transistor 1A is mounted on a base member defined as a ground potential (reference potential), the base member and the backside metal film 45 are electrically connected via a conductive bonding material such as a sintered silver paste. Thus, the ground potential is applied to the source electrode 22.

As shown in FIG. 9, the planar shape of the backside metal film 45 is similar to the back surface 3b, and in the third embodiment, has a rectangular shape. The outer peripheral edge of the backside metal film 45 is provided along the side faces 3d to 3g of the substrate 3 and spaced from the side faces 3d to 3g of the substrate 3. The distance L1 between the side faces 3d to 3g of the substrate 3 and the backside metal film 45 is, for example, in the range of 250 to 300 μm. The thickness t1 (see FIG. 10) of the backside metal film 45 is, for example, in the range of 3 to 10 μm. The backside metal film 45 has a laminated structure including, for example, a TiW layer and an Au layer on the TiW layer.

The drain wiring 33 is a metal film provided on the nitride semiconductor layer 4. The drain wiring 33 has a laminated structure similar to those of the gate pad 31 and the source wiring 32, for example, the laminated structure including a TiW layer and an Au layer on the TiW layer. The drain wirings 33 extend on the respective drain electrodes 23 and has a portions (finger portion) 33b covering the respective drain electrodes 23. The drain wirings 33 are respectively electrically connected with the drain electrodes 23 with a low resistance by being in contact with the respective drain electrodes 23. In addition, a portion 33a (drain pad) of the drain wiring 33 located close to the side face 3e is another example of the electrode pad in the third embodiment, and is disposed along the side face 3e and has a rectangular shape in which, for example, the direction Y is the longitudinal direction. The portion 33a of drain wiring 33 is electrically connected to the external wiring through a bonding wire. Therefore, the surface of the portion 33a of the drain wiring 33 is exposed from the opening of the insulating film 9.

The polyimide wall 46A is a bank-like structure made of polyimide, is provided on the back surface 3b between the side faces 3d to 3g of the substrate 3 and the backside metal film 45, and extends along the edge of the backside metal film 45. In FIG. 8, the polyimide wall 46A is indicated by a hidden line (broken line). The polyimide wall 46A of the third embodiment is in contact with the back surface 3b, and is space from the side faces 3d to 3g of the substrate 3 and the backside metal film 45. The distance L2 between the side faces 3d to 3g of the substrate 3 and the polyimide wall 46A is at least 100 μm. The distance L3 between the backside metal film 45 and the polyimide wall 46A is, for example, in the range of 50 to 100 μm. As shown in FIG. 10, the thickness t2 of the polyimide wall 46A based on the back surface 3b is thicker than the thickness t1 of the backside metal film 45. The thickness t1 is, for example, in the range of 3 to 10 μm. In an embodiment, the thickness t1 is 10 μm. The width W in the direction orthogonal to the extending direction of the polyimide wall 46A is, for example, in the range of 50 to 100 μm. The shape of the cross section perpendicular to the extending direction of the polyimide wall 46A can be, for example, various shapes such as a square shape, a rectangular shape, a trapezoidal shape, and a semicircular shape.

As shown in FIG. 9, the polyimide wall 46A of the third embodiment extends along the four sides of the rectangular back surface 3b, and has a rectangular frame planar shape. Specifically, the polyimide wall 46A has a portion 46a extending along one side (side face 3d) and a portion 46b extending along the other side (side face 3e) of the pair of sides of the back surface 3b facing each other in the direction X. Furthermore, the polyimide wall 46A of the third embodiment has a portion 46c extending along one side (side face 3f) and a portion 46d extending along the other side (side face 3g) of the another pair of sides connecting the above pair of sides. The portions 46a to 46d are connected to each other at their respective ends, and have a rectangular frame shape as a whole. However, the portions 46c and 46d have discontinuities 46e and 46f which are disconnected midway in the extending direction. The discontinuities 46e and 46f are formed, for example, in the center of the portions 46c and 46d in the direction X.

A method of manufacturing the transistor 1A of the third embodiment having the above configuration will be described. First, the nitride semiconductor layer 4 is formed on the wafer-like growth substrate 30, and the wafer-like substrate 3 is manufactured. Specifically, first, an AlN buffer layer is epitaxially grown on the wafer-like growth substrate 30, a GaN channel layer is epitaxially grown thereon, an AlGaN (or InAlN) barrier layer is epitaxially grown thereon, and a GaN cap layer is epitaxially grown thereon. The inactive region is formed by ion-implanting Ar$^+$ into the portion other than the active region of the nitride semiconductor layer 4. Thus, the wafer-like substrate 3 is produced.

Figure 13A:
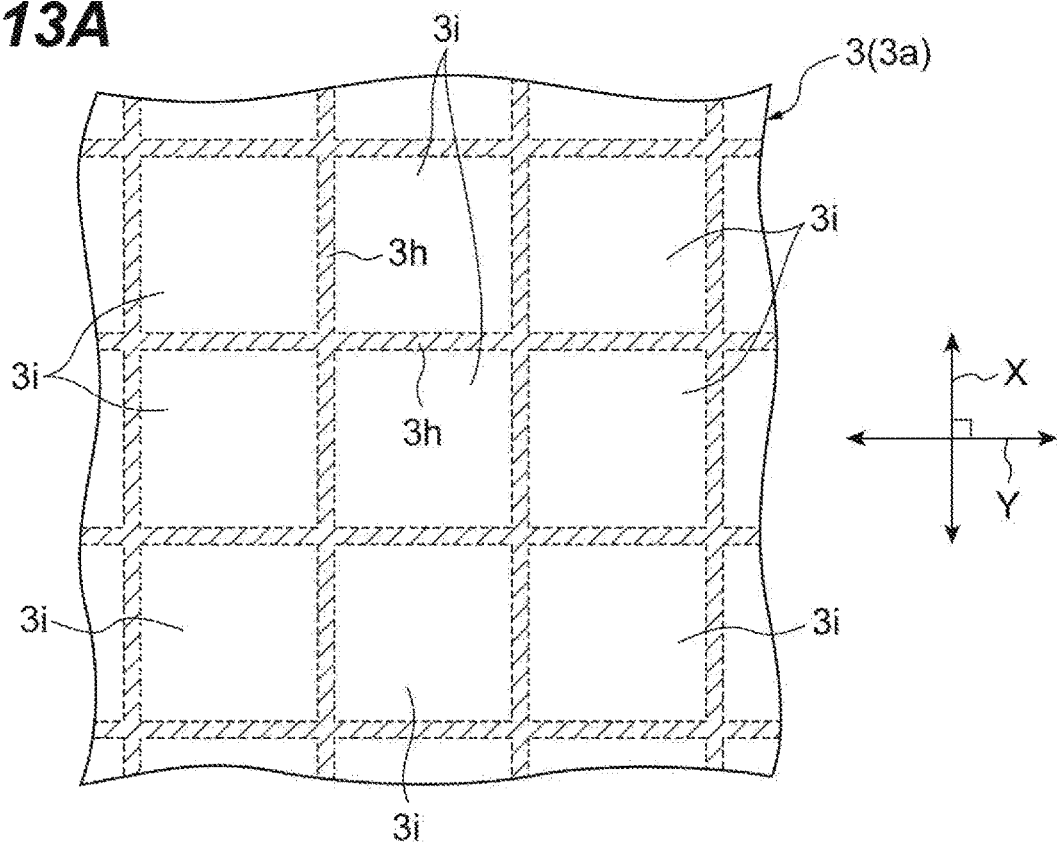
FIG. 13A is a plan view showing a main surface 3a of a wafer-like substrate 3.
Figure 13B:
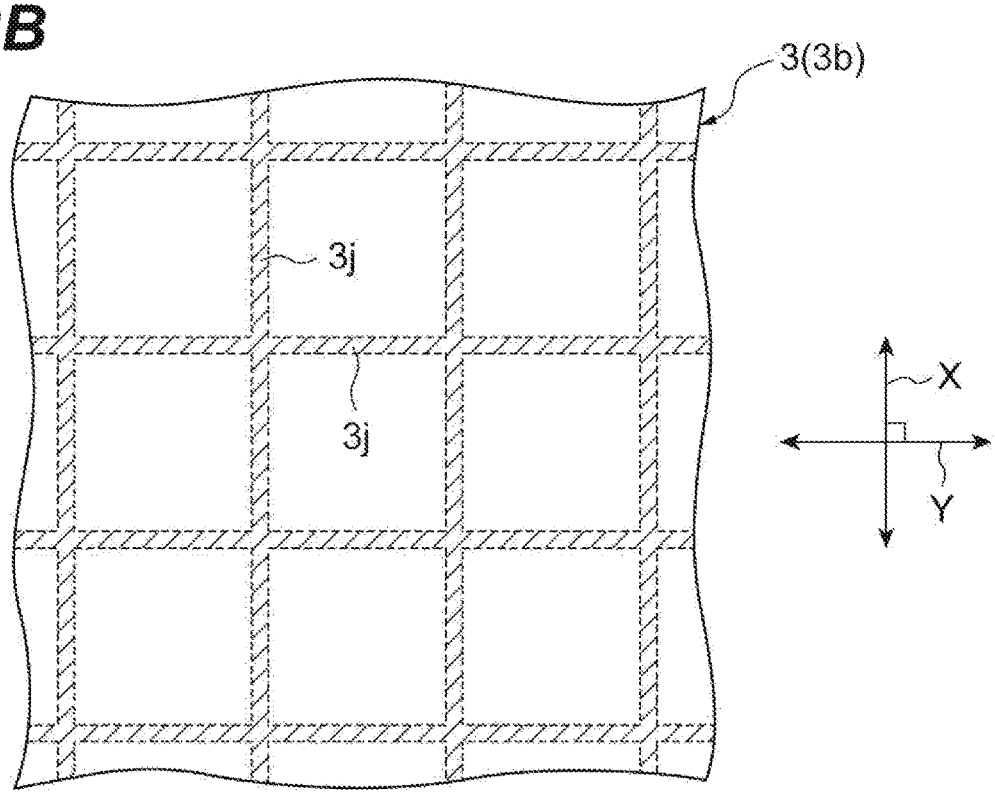
FIG. 13B is a bottom view showing a back surface 3b of the wafer-like substrate 3.

FIG. 13A is a plan view showing part of the main surface 3a of the wafer-like substrate 3 in an enlarged manner. FIG. 13B is a bottom view showing part of the back surface 3b of the wafer-like substrate 3 in an enlarged manner. As shown in FIG. 13A, the wafer-like substrate 3 has a scribe region 3h (indicated by hatching in the figure) on the main surface 3a. The scribe region 3h has a lattice-like planar shape extending along the directions X and Y. A plurality of regions 3i defined by the scribe region 3h is device regions in which the transistor 1A is formed, and each is rectangular. Each region 3i includes at least one active region. Further, as shown in FIG. 13B, the back surface 3b of the wafer-like substrate 3 includes a region 3j (first region, hatched in the figure) obtained by projecting the scribe region 3h onto the back surface 3b. The region 3j has a grid-like planar shape extending along directions X and Y as with the scribe region 3h.

FIGS. 14A to 18C are cross-sectional views showing the first half steps included in the method of manufacturing the transistor 1A. Each of FIGS. 14A, 15A, 16A, 17A and 18A shows a cross section corresponding to line X-X in FIG. 8. Each of FIGS. 14B, 15B, 16B, 17B and 18B shows a cross section corresponding to line XI-XI in FIG. 8. Each of FIGS. 14C, 15C, 16C, 17C and 18C shows a cross section corresponding to the XII-XII line of FIG. 8.

Figure 14A:
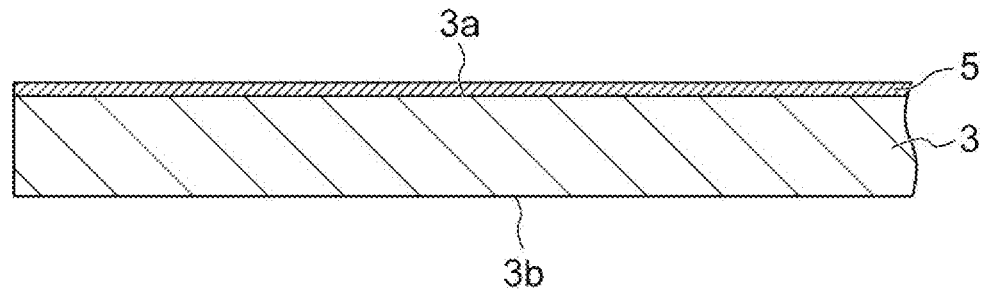
FIGS. 14A to 14C are cross-sectional views showing the first half of the respective steps included in the method of manufacturing the transistor 1A.
Figure 14B:
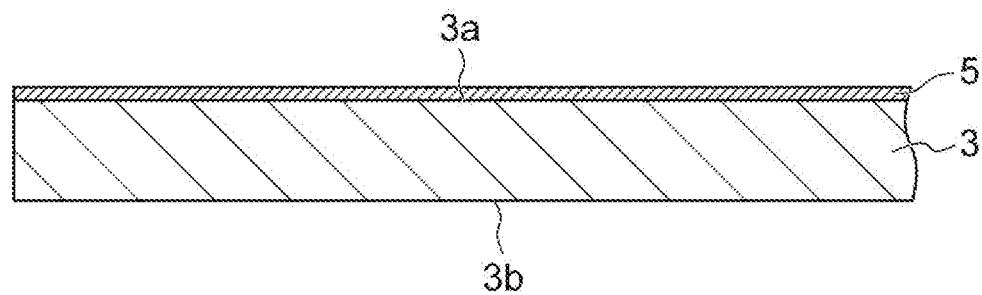
Figure 14C:
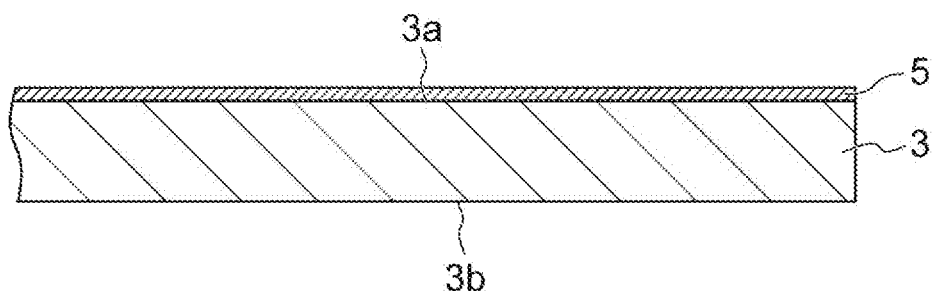

As shown in FIGS. 14A-14C, the insulating film 5 is deposited on the main surface 3a of the substrate 3. For example, when the insulating film 5 is made of a silicon compound such as SiN, the insulating film 5 is deposited by the plasma CVD method or a low pressure CVD (LPCVD) method. In the case of LPCVD, the film formation temperature is, for example, 850° C., and the film formation pressure is, for example, 10 Pa or less. The film formation raw material is, for example, $NH_3$ and $SiH_2Cl_2$. When using the plasma CVD method, temperature 300° C., $SiH_4$ and $NH_3$ as raw material gas, $N_2$ as dilution gas, RF frequency 13.56 MHz and power 50 W for plasma generation device, etc. are selected as the film forming conditions. The thickness of the insulating film 5 is, for example, in the range of 60 to 100 nm, and is 60 nm in an embodiment.

Figure 15A:
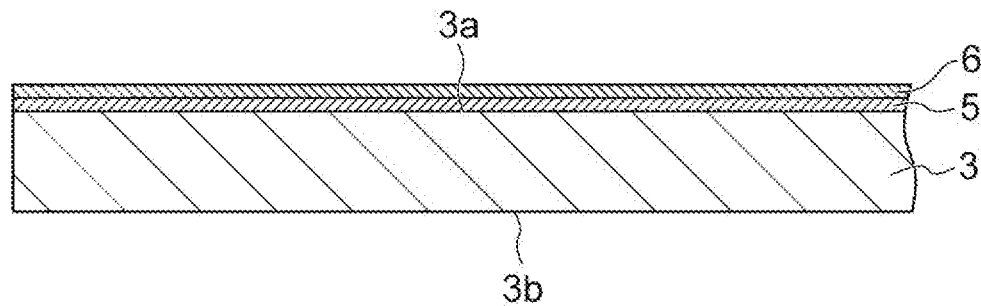
FIGS. 15A to 15C are cross-sectional views showing the first half of the respective steps included in the method of manufacturing the transistor 1A.
Figure 15B:
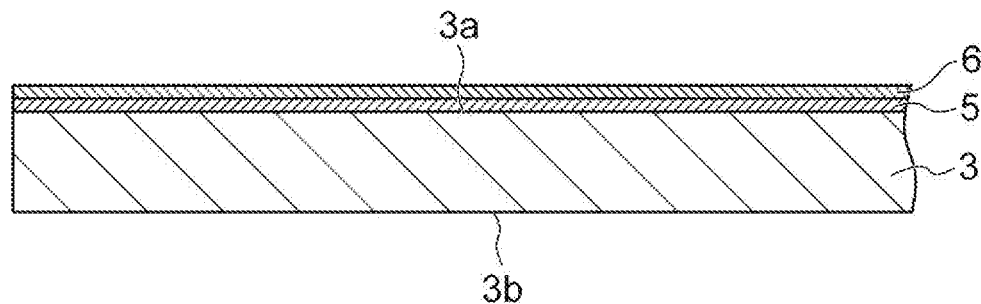
Figure 15C:
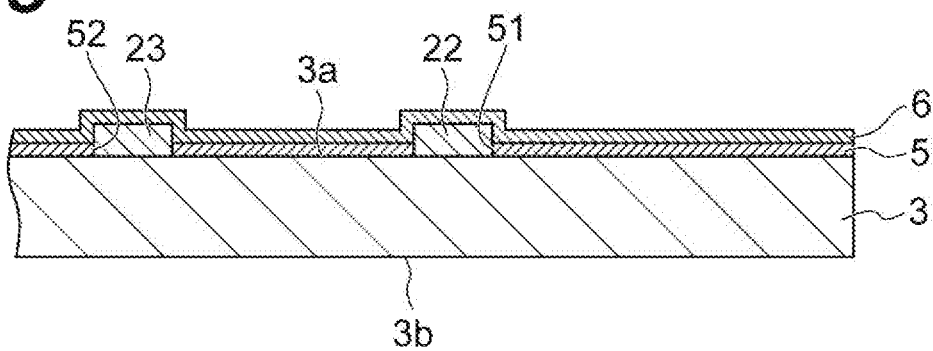

Subsequently, as shown in FIG. 15C, the source opening 51 corresponding to the source electrode 22 and the drain opening 52 corresponding to the drain electrode 23 are formed in the insulating film 5. Specifically, a resist mask having an opening pattern corresponding to the source opening 51 and the drain opening 52 is formed on the insulating film 5, and the insulating film 5 is etched through the opening pattern. Thus, the source opening 51 and the drain opening 52 are formed. Thereafter, using the lift-off method, the source electrode 22 is formed in the source opening 51, and the drain electrode 23 is formed in the drain opening 52. That is, with the resist mask remaining, metal layers (for example, Ti/Al/Ti or Ta/Al/Ta) for the source electrode 22 and the drain electrode 23 are sequentially deposited using a physical vapor deposition or the like. The thickness of each Ti layer (or Ta layer) is, for example, in the range of 10 to 30 nm (10 nm in an embodiment), and the thickness of the Al layer is, for example, in the range of 200 to 400 nm (300 nm in an embodiment). After the metal material deposited on the resist mask is removed together with the resist mask, heat treatment (annealing) is performed at a temperature in the range of 500 to 600° C. (in an embodiment, 550° C.). Thereby, the source electrode 22 and the drain electrode 23 are alloyed. The time for maintaining the temperature in the range of 500 to 600° C. is, for example, one minute.

Subsequently, as shown in FIGS. 15A to 15C, the insulating film 6 covering the insulating film 5, the source electrode 22 and the drain electrode 23 is deposited. For example, when the insulating film 6 is made of a silicon compound such as SiN, the insulating film 6 is deposited by the plasma CVD method. The film formation temperature is, for example, 300° C., and the film formation raw material is, for example, $NH_3$ and $SiH_4$. The thickness of the insulating film 6 is, for example, 100 nm.

Figure 16A:
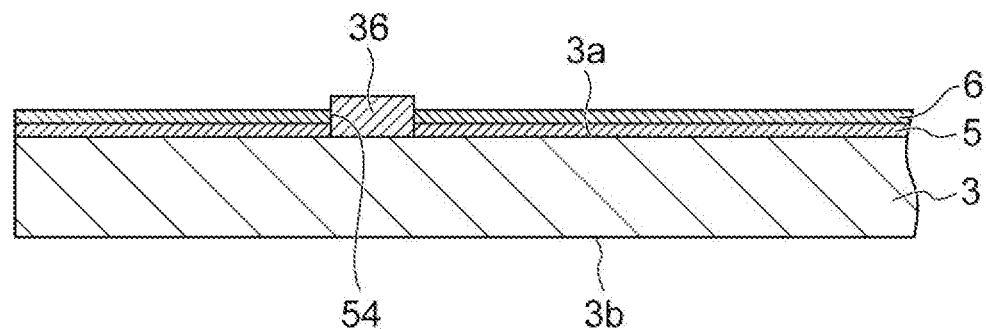
FIGS. 16A to 16C are cross-sectional views showing the first half of the respective steps included in the method of manufacturing the transistor 1A.
Figure 16B:
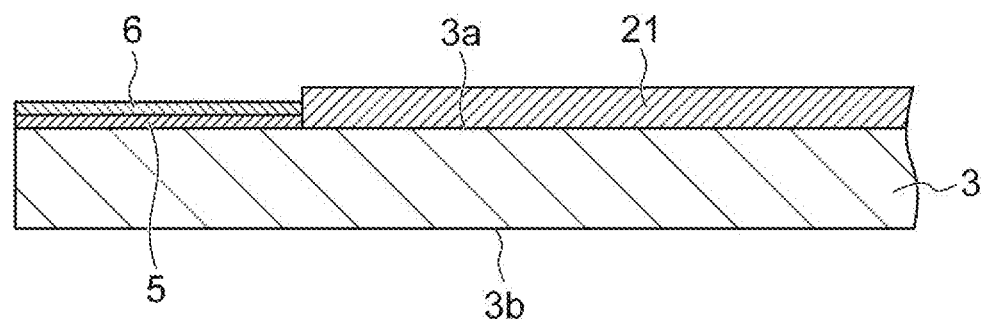
Figure 16C:
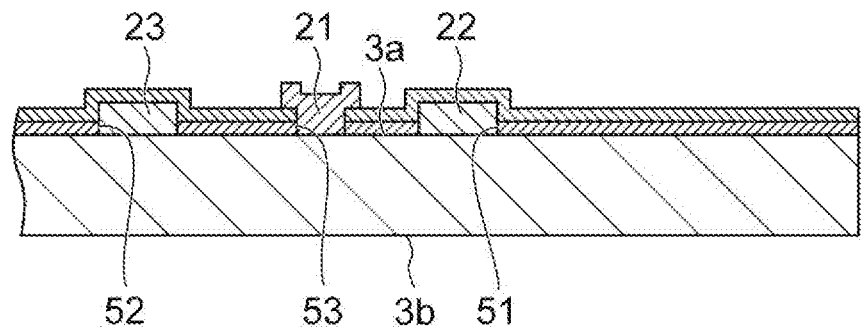

Subsequently, the lower layer 36 of the gate electrode 21 and the source wiring 32 is formed. First, a resist for an electron beam (EB) is deposited on the insulating film 6, and an opening pattern for the gate electrode 21 and the lower layer 36 is formed in the EB resist by EB writing. Next, the insulating film 6 and the insulating film 5 are continuously etched through the opening pattern of the EB resist to form the gate opening 53 and an opening 54 penetrating the insulating films 5 and 6 as shown in FIGS. 16B and 16C, so that the nitride semiconductor layer 4 is exposed. Thereafter, using the lift-off method, the gate electrode 21 is formed in the gate opening 53, and at the same time, the lower layer 36 of the source wiring 32 is formed in the opening 54. That is, while the EB resist remaining, metal layers (for example, Ni/Au or Ni/Pd/Au) for the gate electrode 21 and the lower layer 36 are sequentially deposited using a physical vapor deposition or the like. The thickness of the Ni layer is, for example, in the range of 70 to 150 nm (in an embodiment, 100 nm), the thickness of the Pd layer is, for example, in the range of 50 to 100 nm (in an embodiment, 50 nm), and the thickness of the Au layer is, for example, in the range of 300 to 700 nm (in an embodiment, 500 nm). Thereafter, the metal material deposited on the EB resist is removed together with the EB resist.

Figure 17A:
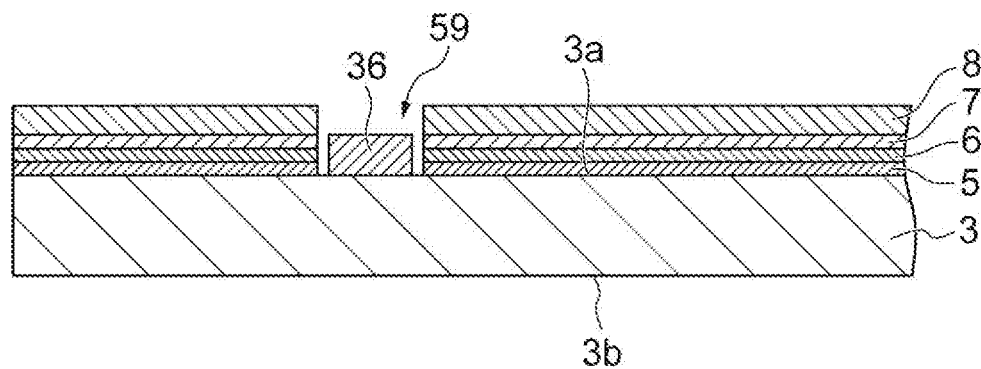
FIGS. 17A to 17C are cross-sectional views showing the first half of the respective steps included in the method of manufacturing the transistor 1A.
Figure 17B:
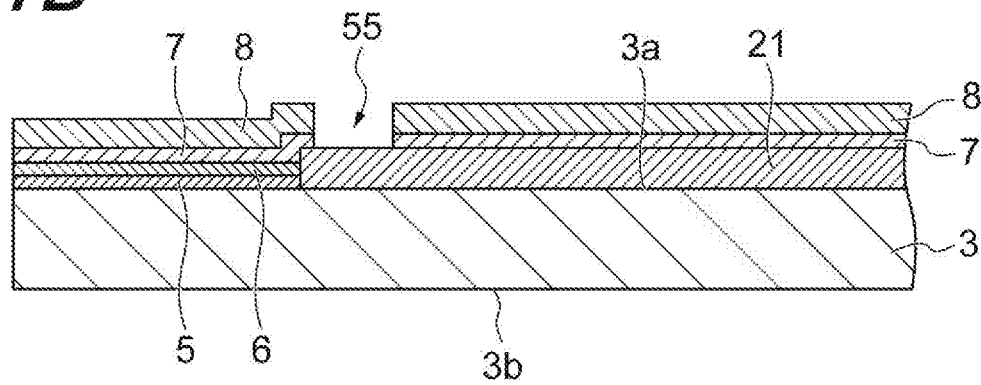
Figure 17C:
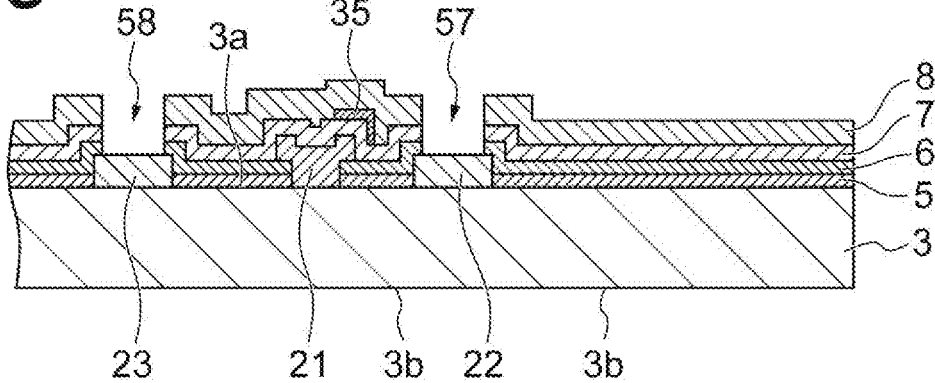

Subsequently, as shown in FIGS. 17A to 17C, the insulating film 7 is deposited. Initially, the insulating film 7 is formed on the entire surface of the main surface 3a to cover the insulating film 6, the gate electrode 21 and the lower layer 36. For example, when the insulating film 7 is made of a silicon compound such as SiN, the insulating film 7 is deposited by the plasma CVD method. The film formation temperature is, for example, 300° C., and the film formation raw material is, for example, $NH_3$ and $SiH_4$. The thickness of the insulating film 7 is, for example, 100 nm.

Subsequently, as shown in FIG. 17C, the field plate 35 is formed on the insulating film 7 along the finger portion of the gate electrode 21. In this process, the field plate 35 is formed using, for example, the lift-off method. That is, a resist mask having an opening pattern corresponding to the planar shape of field plate 35 is formed, and metal layers (for example, Ti (or Ni)/Au) for field plate 35 are sequentially deposited using the physical vapor deposition or the like. In an embodiment, the thickness of the Ti layer (or Ni layer) is 10 nm and the thickness of the Au layer is 200 nm. Thereafter, the metal material deposited on the resist mask is removed together with the resist mask.

Subsequently, the insulating film 8 covering the insulating film 7 and the field plate 35 is deposited. Initially, the insulating film 8 is formed on the entire surface of main surface 3a. For example, when the insulating film 8 is made of a silicon compound such as SiN, the insulating film 8 is deposited by the plasma CVD method. The film formation temperature is, for example, 300° C., and the film formation raw material is, for example, $NH_3$ and $SiH_4$.

Subsequently, as shown in FIG. 17A, the insulating films 7 and 8 on the lower layer 36 are removed by etching to form an opening 59, and the lower layer 36 is exposed. At the same time, as shown in FIG. 17C, the insulating films 5 to 8 in the regions corresponding to the source wiring 32 and the drain wiring 33 are removed by etching to form openings 57 and 58, and the source electrode 22 and the drain electrode 23 are exposed. At the same time, as shown in FIG. 17B, the insulating films 7 and 8 in the region corresponding to the gate pad 31 are removed by etching to form an opening 55, and the gate electrode 21 is exposed. Specifically, a resist mask having an opening pattern corresponding to each of the openings 55, 57 to 59 is formed on the insulating film 8, and the insulating films 5 to 8 are etched through the opening pattern to form each of the above openings.

Further, in this process, the opening 55 for the gate pad 31, an opening for a source pad 32a, and an opening for the portion 33a of the drain wiring 33 are formed along the scribe region 3h shown in FIG. 13A. Specifically, the openings 55 for the gate pad 31 and the opening for the source pad 32a are alternately disposed along the portion of the scribe region 3h for forming the side face 3d. In addition, an opening for the portion 33a of the drain wiring 33 is formed along the portion of the scribe region 3h for forming the side face 3e.

Figure 18A:
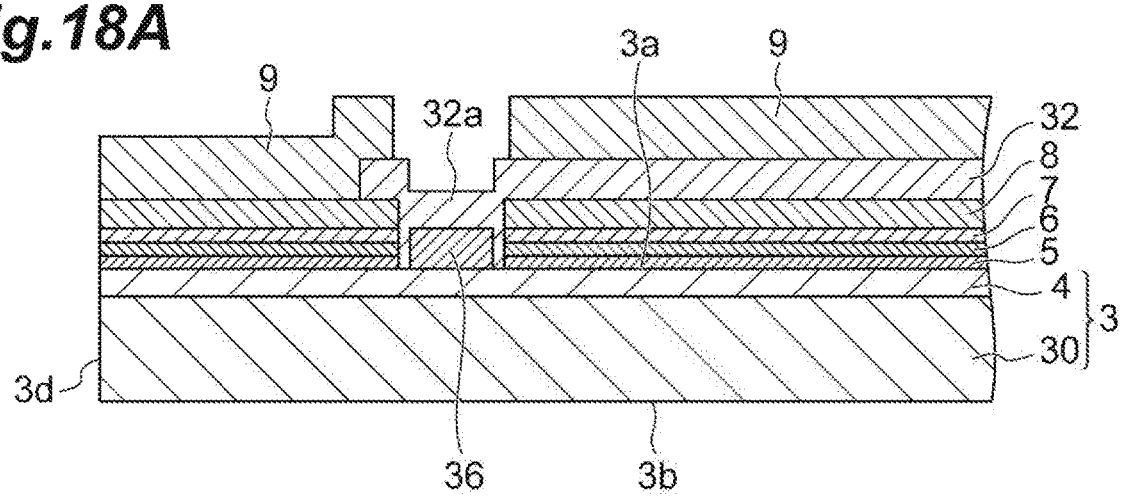
FIGS. 18A to 18C are cross-sectional views showing the first half of the respective steps included in the method of manufacturing the transistor 1A.
Figure 18B:
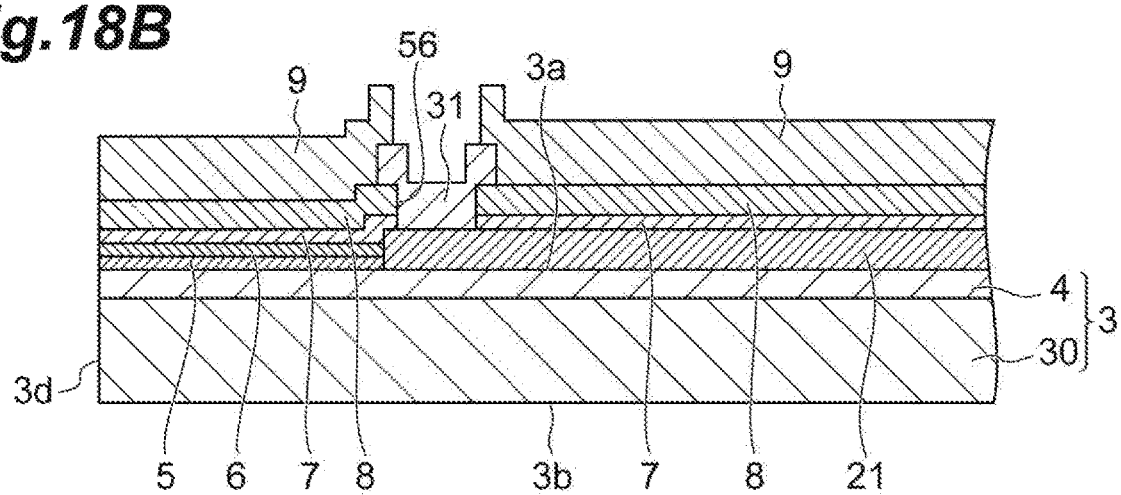
Figure 18C:
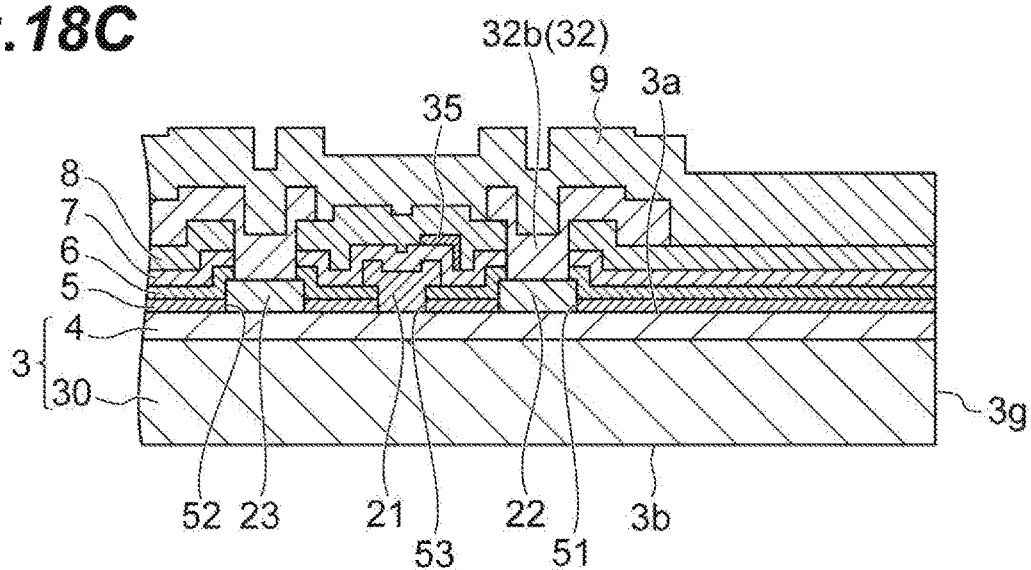

After removing the resist mask, as shown in FIGS. 18A to 18C, the gate pad 31, the source wiring 32, and the drain wiring 33 are collectively formed. In this process, the gate pad 31, the source pad 32a, and the portion 33a of the drain wiring 33 are disposed along the scribe region 3h shown in FIG. 13A. Specifically, gate pads 31 and source pads 32a are alternately disposed along a portion of scribe region 3h for forming side face 3d, and a portion 33a of the drain wiring 33 is disposed along a portion of scribe region 3h for forming side face 3e.

For that purpose, first, a seed metal layer (Ti/TiW/Ti/Au) is formed by sputtering over the entire surface of the main surface 3a. The thickness of each Ti layer is, for example, 10 nm, the thickness of the TiW layer is, for example, 100 nm, and the thickness of the Au layer is, for example, 100 nm. Next, a resist mask having an opening in each formation planned region of the gate pad 31, the source wiring 32, and the drain wiring 33 is formed on the seed metal layer. Electrolytic plating is performed to form the Au layer in the opening of the resist mask. At this time, the thickness of the Au layer is, for example, 3 µm. After the plating process, the resist mask is removed and the exposed seed metal layer is removed. Thus, the gate pad 31, the source wiring 32, and the drain wiring 33 described above are collectively formed.

Subsequently, the insulating film (passivation film) 9 is deposited on the entire surface of the main surface 3a. For example, when the insulating film 9 is made of a silicon compound such as SiN, the insulating film 9 is deposited by the plasma CVD method. The film formation temperature is, for example, 300° C., and the film formation raw material is, for example, $NH_3$ and $SiH_4$. Thereafter, openings of the insulating film 9 are formed on the gate pad 31, the source pad 32a, and the portion 33a of the drain wiring 33 to expose these. Thus, the process on the main surface 3a side is completed.

Figure 19A:
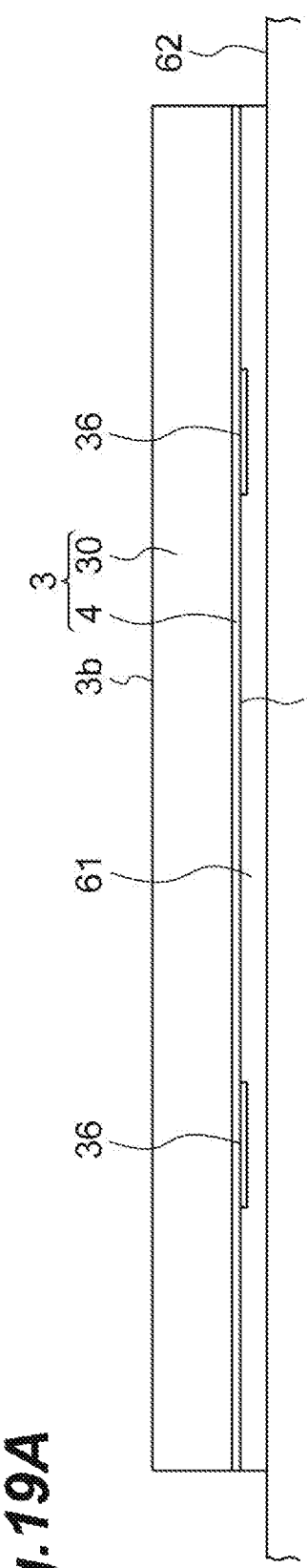
FIGS. 19A to 19C are cross-sectional views showing the latter half of the respective steps included in the method of manufacturing the transistor 1A.

FIGS. 19A to 22C are schematic views showing cross sections of the latter half of the steps included in the method of manufacturing the transistor 1A. In FIGS. 19A-22C, the illustration of the structure of components other than the lower layer 36 on the other main surface 3a is omitted. Subsequently, as shown in FIG. 19A, a protective resist 61 is formed on the main surface 3a by spin coating, and the resist 61 covers all the components on the main surface 3a. Next, a support substrate 62 is attached to the resist 61. The support substrate 62 is made of, for example, $SiO_2$. Subsequently, the back surface 3b of the substrate 3 is polished to thin the substrate 3. At this time, for example, the growth substrate 30 having a thickness of 500 µm is thinned to 100 µm.

Figure 19B:
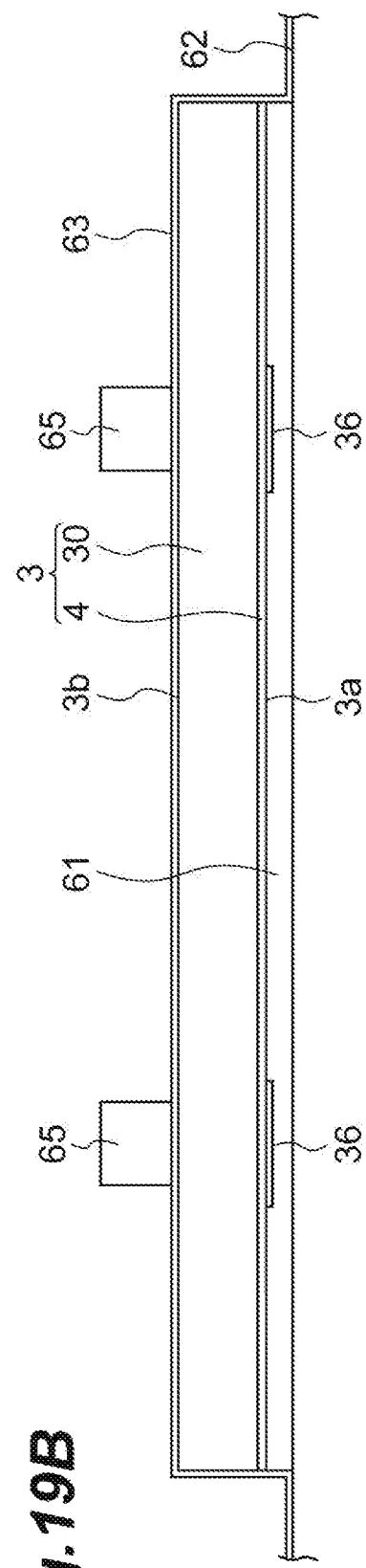
Figure 19C:
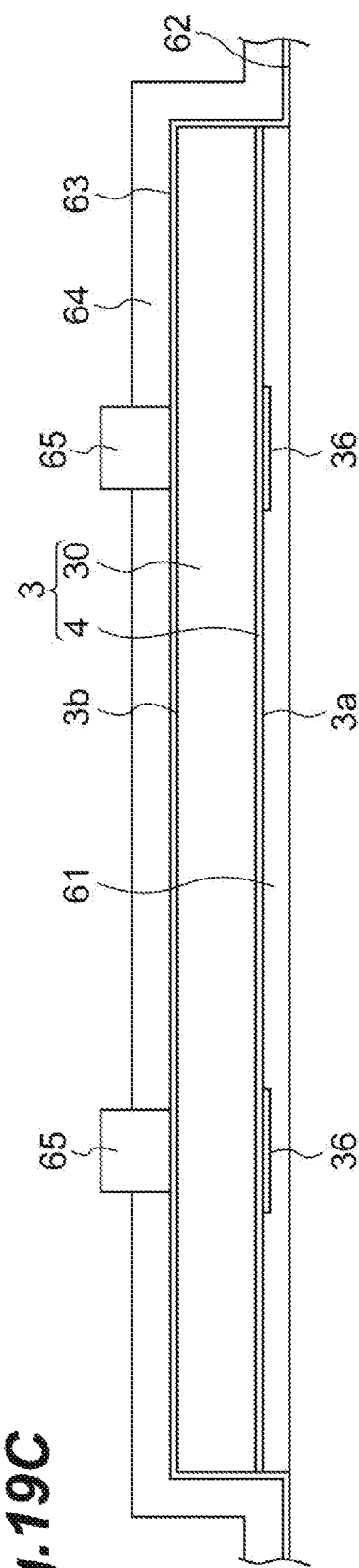

Subsequently, as shown in FIG. 19B, a seed metal film 63 (for example, TiW/Au) is formed on the back surface 3b and the side faces of the substrate 3 by, for example, the sputtering method. After a resist pattern 65 is formed at a position facing the lower layer 36, as shown in FIG. 19C, an Ni mask 64 is formed by plating Ni. Thereafter, as shown in FIG. 20A, the resist pattern 65 is removed, and the exposed portion of the seed metal film 63 is etched away. Thereby, the region of the back surface 3b facing the lower layer 36 is exposed through the opening of the Ni mask 64. When the seed metal film 63 is made of TiW/Au, the seed metal film 63 can be easily removed by reactive ion etching (RIE) using a fluorine-based gas.

Subsequently, the substrate 3 (the growth substrate 30 and the nitride semiconductor layer 4) is etched through the opening of the Ni mask 64 to form a hole 3c (see FIG. 10) penetrating the substrate 3. In this process, the hole 3c are formed by reactive ion etching (RIE). Specifically, as shown in FIG. 20B, first, the growth substrate 30 is etched by RIE using a fluorine-based gas. When all the growth substrate 30 is etched, the Ni mask 64 is removed (FIG. 20C). Next, the reactive gas is changed, and the nitride semiconductor layer 4 is etched by RIE using a chlorine-based gas (FIG. 21A).

The lower layer 36 includes a Ni layer and an Au layer on the Ni layer, and the Ni layer is first exposed as the etching of the nitride semiconductor layer 4 proceeds. At this time, the Ni layer is slightly etched by the chlorine-based gas, but the etching rate of Ni by the chlorine-based gas is much smaller than the etching rate of the nitride semiconductor by the chlorine-based gas. Therefore, the etching can be stopped in the lower layer 36. Even if the Ni layer is removed by the sputtering effect, the etching by the chlorine-based gas is reliably stopped at the Au layer because the Au layer much thicker than the Ni layer is provided on the Ni layer. Thus, the through hole 3c from the back surface 3b of the substrate 3 to the lower layer 36 is formed, and the lower layer 36 is exposed to the back surface 3b side through the through hole 3c.

In the above etching process, the Ni mask 64 is removed when all the growth substrate 30 is etched, and then the nitride semiconductor layer 4 is etched by a chlorine-based gas. The Ni mask 64 is required to be removed by the next process, but the Ni layer of the lower layer 36 is exposed in the through hole 3c immediately after the through hole 3c is formed. If the removal process of the Ni mask 64 is performed in this state, the Ni layer of the lower layer 36 is also removed simultaneously. Therefore, the Ni mask 64 is removed before the Ni layer of the lower layer 36 is exposed, that is, after the etching of the growth substrate 30 is completed, and before the etching of the nitride semiconductor layer 4 is started.

When the nitride semiconductor layer 4 is etched, it is possible to perform etching with a fluorine-based gas continuously starting from the growth substrate 30 and to etch the nitride semiconductor layer 4 by the sputtering effect.

Subsequently, as shown in FIG. 21B, a seed metal film 66 (for example, TiW/Au) is formed on the back surface 3b of the substrate 3 and the inner surface of the through hole 3c (including the exposed lower layer 36) by, for example, sputtering. A resist pattern 67 is formed on the region 3j (see FIG. 13B) overlapping the scribe region 3h (see FIG. 13A). At this time, the width in the direction orthogonal to the extending direction of resist pattern 67 is made larger than the width of the region 3j (that is, the width of scribe region 3h). In other words, as viewed in the normal direction of back surface 3b, the region 3j is included in the resist pattern 67 and the edge of region 3j is located inside the resist pattern 67.

Figure 22A:
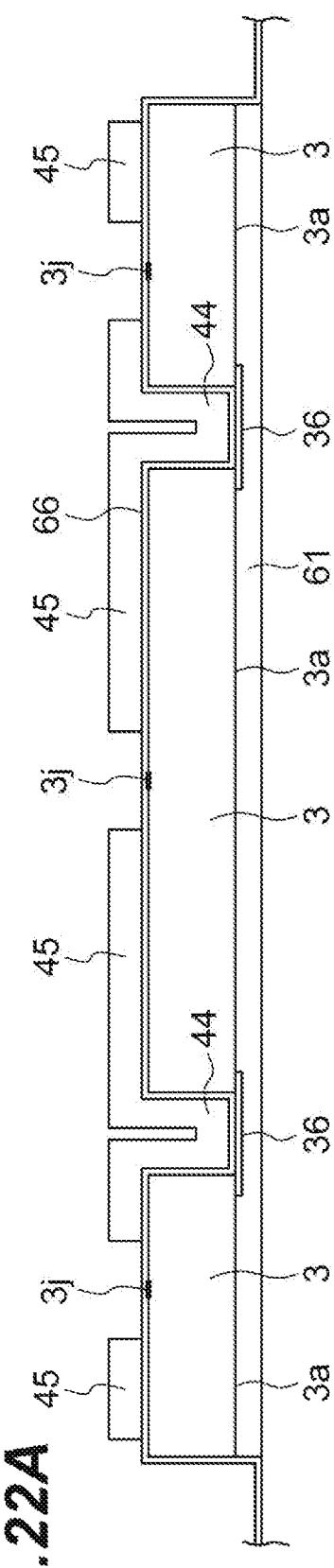
FIGS. 22A to 22C are cross-sectional views showing the latter half of the respective steps included in the method of manufacturing the transistor 1A.
Figure 22B:
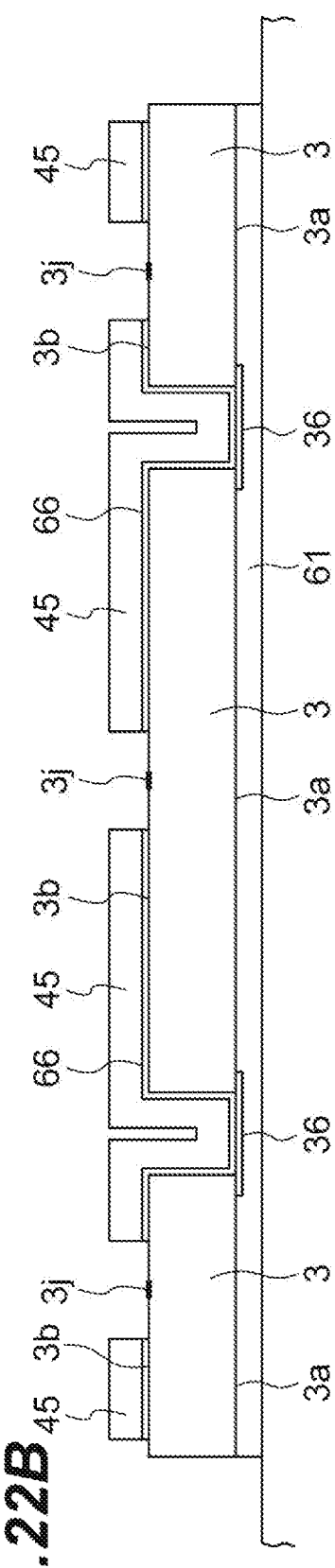

Thereafter, as shown in FIG. 21C, electrolytic plating is performed on the seed metal film 66 exposed from the resist pattern 67 to form the backside metal film 45 on the back surface 3b and to form the metal via 44, in the through hole 3c, reaching the lower layer 36 from the back surface 3b. Since the width of the resist pattern 67 is larger than the width of region 3j, backside metal film 45 is formed spaced apart from the region 3j. Thereafter, as shown in FIG. 22A, the resist pattern 67 is removed, and the exposed seed metal film 66 is removed by etching (for example, RIE) using a fluorine-based gas (FIG. 22B).

Figure 22C:
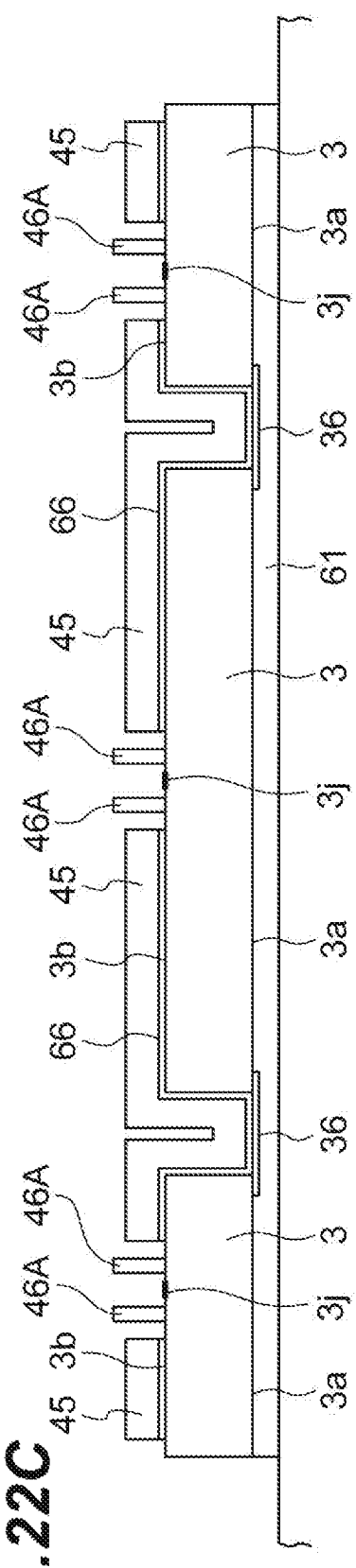

Subsequently, as shown in FIG. 22C, the polyimide wall 46A extending along the edge of the backside metal film 45 is formed by coating the region (second region) between the region 3j and the backside metal film 45. The coating method of the polyimide wall 46A is, for example, screen printing. In the third embodiment, the portions 46a and 46b (see FIG. 9) of the polyimide wall 46A are formed along the respective portions of the region 3j corresponding to the side faces 3d and 3e of the substrate 3. The portions 46c and 46d (see FIG. 9) of the polyimide wall 46A are formed along the respective portions of the region 3j corresponding to the side faces 3f and 3g of the substrate 3.

In this process, the polyimide wall 46A is formed spaced away from both the region 3j and the backside metal film 45. Thereby, as shown in FIG. 9, the back surface 3b of the substrate 3 will be exposed between the side faces 3d to 3g of the substrate 3 and the polyimide wall 46A, and between the polyimide wall 46A and the backside metal film 45 of the completed transistor 1A. Further, in this process, the discontinuities 46e and 46f are formed in the portions 46c and 46d of the polyimide wall 46A formed along the respective portions of the region 3j corresponding to the side faces 3f and 3g of the substrate 3. By providing such discontinuities 46e and 46f, it is possible to support a mask located inside the polyimide wall 46A during screen printing.

Subsequently, the protection resist 61 is removed to separate the component on the main surface 3a side of the substrate 3 from the support substrate 62 (FIG. 23A). Heat treatment is performed to cure the polyimide wall 46A. The temperature of the heat treatment is, for example, 250° C., and the heat treatment time is, for example, one hour. Thereafter, the back surface 3b of the substrate 3 is attached to the expanding tape, and cutting (dicing) is performed along the scribe region 3h to separate the plurality of regions 3i (device region, see FIG. 13A) from each other. A plurality of semiconductor chips each including a device region is fabricated (FIG. 23B). Through the above process, the transistor 1A of the third embodiment is completed.

The effects obtained by the transistor 1A of the third embodiment described above will be described together with the conventional example. Usually, the backside metal film 45 is conductively bonded to the metal base member through the conductive bonding material. In many cases, the base member is set to a reference potential (ground potential). In this case, when a negative voltage lower than the reference potential is applied to the gate electrode 21, an electric field which makes the gate pad 31 side negative is generated between the gate pad 31 and the base member. Under a humid environment, due to this electric field, an ion migration of metals (for example, Ag, Au, Cu, etc.) contained in the conductive bonding material is likely to occur. The ion migration is a phenomenon in which ionized metal moves on the surface of a substance between electric fields. Metal ions are attracted to the electric field, reduce from the ionized state to metal for some reason, and accumulate to form dendrites. When the metal dendrite grows from the conductive bonding material, the gate pad 31 and the backside metal film 45 short circuit, resulting in the operation failure of the transistor.

In recent years, development of wide gap semiconductors mainly made of GaN, SiC, $Ga_2O_3$ or the like has been promoted and is in practical use. Since the wide gap semiconductor has a high withstand voltage, the performance of the semiconductor is improved by raising the power supply voltage to increase the mobility or reducing the interelectrode parasitic capacitance. Therefore, in the case of a wide gap semiconductor, the above-mentioned electric field is strong, and ion migration easily occurs.

Therefore, in the transistor 1A of the third embodiment, the backside metal film 45 is provided on the back surface 3b having a distance from the side faces 3d to 3g of the substrate 3, and the polyimide wall 46A extending along the edge of the backside metal film 45 is provided on the back surface 3b between the side faces 3d to 3g and the backside metal film 45. The growth of dendrite from the conductive bonding material is suppressed by the polyimide wall 46A. Therefore, a short circuit between the backside metal film 45 and the gate pad 31 due to the ion migration of the metal contained in the conductive bonding material can be reduced.

In the third embodiment, the polyimide wall 46A may be formed spaced apart from the region 3j, and the back surface 3b of the substrate 3 may be exposed between the side faces 3d to 3g of the substrate 3 and the polyimide wall 46A. In this case, the polyimide wall 46A is reliably formed directly on the back surface 3b of the substrate 3. If there is no interval, process variations may increase the possibility of forming the polyimide wall 46A on the backside metal film 45. The adhesion of the backside metal film 45 to the polyimide is low. In this case, the distance between the side faces 3d to 3g of the substrate 3 and the polyimide wall 46A may be at least 100 μm. Thereby, even if a conductive bonding member such as a sintered metal type silver paste crawls up on the polyimide wall 46A, there is still a distance of 100 μm to the gate pad 31 and the possibility that the gate pad 31 and the ground potential short circuit is reduced.

In the third embodiment, the polyimide wall 46A may be formed spaced apart from the backside metal film 45, and the back surface 3b of the substrate 3 may be exposed between the backside metal film 45 and the polyimide wall 46A. In this case, since the backside metal film 45 mainly composed of Au having poor adhesion to the polyimide and the polyimide wall 46A do not contact each other, peeling of the polyimide wall 46A can be reduced.

In the third embodiment, the width W in the direction orthogonal to the extending direction of the polyimide wall 46A may be in the range of 50 to 100 μm. In this case, the growth of dendrite from the conductive bonding material can be sufficiently suppressed.

In the third embodiment, the planar shape of the transistor 1A may be a rectangle. The gate pad 31 may be disposed along one side (side face 3d) of the pair of sides facing each other in the rectangle and the drain wiring 33 may be disposed along the other side (side face 3e) of the pair of sides, and the polyimide wall 46A may be formed along at least the one side (side face 3d). As described above, a negative bias voltage may be applied to the gate pad 31. By forming the polyimide wall 46A along the side (side face 3d) on which the gate pad 31 is disposed, a short circuit between the gate pad 31 and the backside metal film 45 can be effectively reduced.

In the third embodiment, the polyimide wall 46A may be further formed along the other side (side face 3e). Although the ion migration does not occur on the drain pad 33a side, since the conductive bonding member does not protrude from the transistor 1A, another circuit component can be disposed in the closest proximity to the transistor 1A. The restriction of the mounting region based on the protrusion of the conductive bonding member can be alleviated, and the deterioration of the high frequency characteristics can be suppressed by disposing the another circuit component in the closest proximity to the transistor 1A.

In the third embodiment, the polyimide wall 46A may be further formed along the another pair of sides (side faces 3f and 3g). Thereby, the growth of dendrites on the side faces 3f and 3g can be suppressed, and the short circuit between the gate pad 31 (and the drain wiring 33) and the backside metal film 45 can be more effectively reduced.

(Modification)

FIG. 24A and FIG. 24B are views showing a modification of a polyimide wall of the third embodiment. A polyimide wall 46B shown in FIG. 24A includes the portion 46a of the polyimide wall 46A of the third embodiment and a portion of the portions 46c and 46d closer to the portion 46a than the discontinuities 46e and 46f, but does not include the portion 46b or a portion of the portions 46c and 46d closer to the portion 46b than the discontinuities 46e and 46f. Even in such a configuration, as in the third embodiment, a short circuit between the backside metal film 45 and the gate pad 31 due to the ion migration of the metal contained in the conductive bonding material can be reduced.

A polyimide wall 46C shown in FIG. 24B does not include the discontinuities 46e and 46f of the third embodiment, and the portions 46c and 46d are continuously formed. In other words, the polyimide wall 46C surrounds the backside metal film 45 from all sides without gaps. Even in such a mode, the function and effect same as those of the third embodiment can be obtained. In this example, since the mask on the inner side of the polyimide wall 46C cannot be supported, screen printing cannot be applied. Therefore, it is preferable to use, for example, a method of applying photosensitive polyimide and performing pattern exposure (photolithography).

Fourth Embodiment

Figure 25:
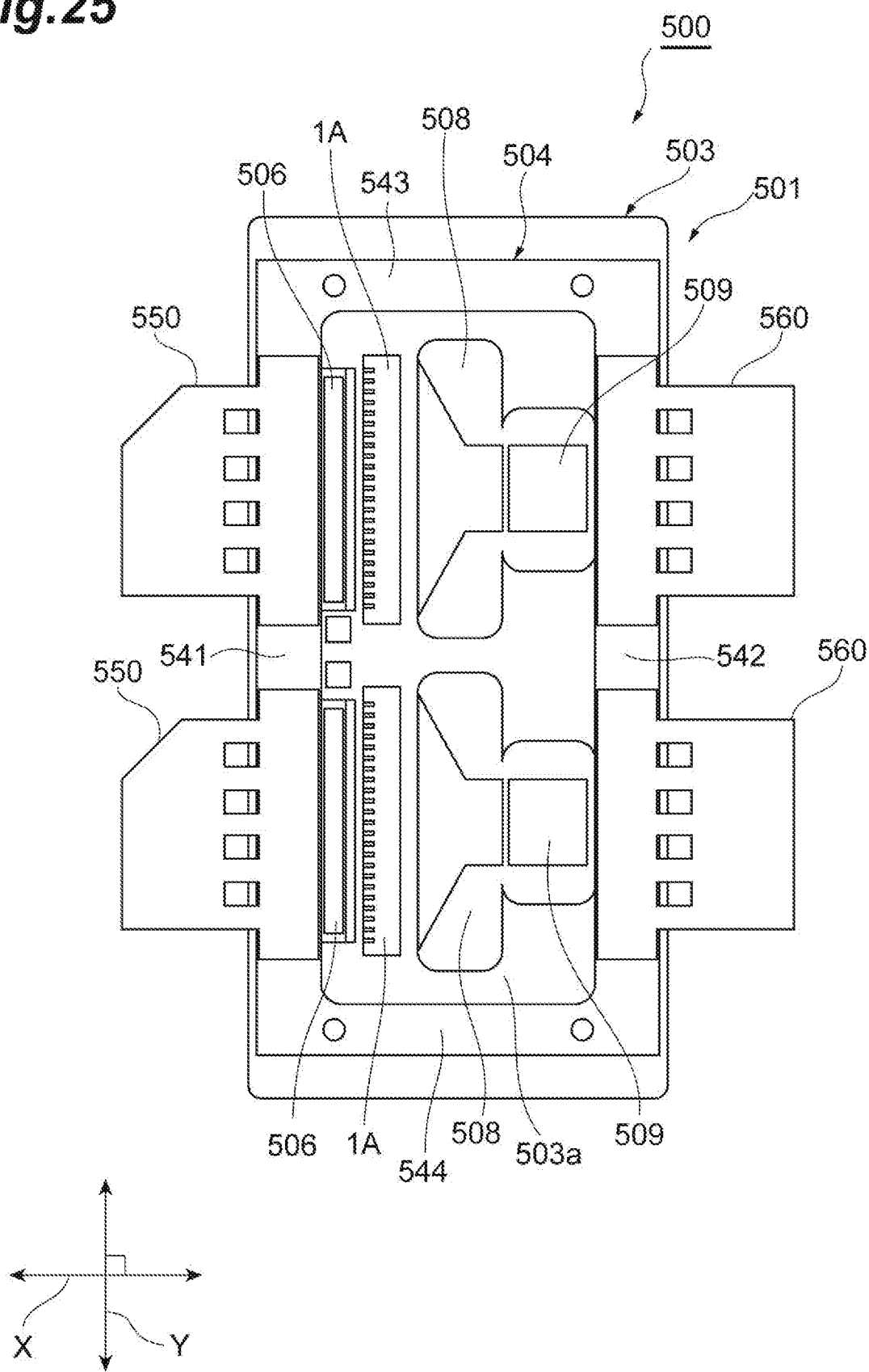
FIG. 25 is a plan view showing the configuration of a semiconductor device 500 according a fourth embodiment.

FIG. 25 is a plan view showing the configuration of a semiconductor device 500 according to the fourth embodiment. FIG. 25 shows a state in which the lid of the semiconductor device 500 is removed. The semiconductor device 500 includes the transistor 1A of the third embodiment, a package 501, an input matching circuit 506, an output matching circuit 508, and an output capacitor 509. The transistor 1A, the input matching circuit 506, the output matching circuit 508, and the output capacitor 509 are housed in the package 501. The package 501 has a non-hermetic structure in which a hermetic seal is not performed.

The package 501 comprises a base 503, a side wall 504, two input leads 550, and two output leads 560. The base 503 is a plate-like member having a flat main surface 503a made of metal. The base 503 may be made of, for example, copper, an alloy of copper and molybdenum, an alloy of copper and tungsten. The base 503 may be a laminate including at least one of a copper plate, a molybdenum plate, a tungsten plate, an alloy plate of copper and molybdenum, an alloy plate of copper and tungsten. The surface of the base 503 is plated with nickel chromium (nichrome)-gold, nickel-gold, nickel-palladium-gold, silver or nickel, nickel-palladium or the like. Gold, silver and palladium are plating materials, and NiCr and Ni etc. are seed materials. Adhesion can be improved when the plating material and the seed material are included rather than when the plating material alone is included. The thickness of the base 503 is, for example, 0.5 to 1.5 mm. The planar shape of the base 503 is, for example, rectangular.

The side wall 504 is a substantially rectangular frame-shaped member made of ceramic as a dielectric. The side wall 504 has a pair of portions 541 and 542 facing each other in the direction X along main surface 503a of the base 503, and a pair of portions 543 and 544 facing each other in the direction Y intersecting with the direction X. The portions 541 and 542 extend parallel to one another along the direction Y, and the portions 543 and 544 extend parallel to one another along the direction Y. The cross section of each of the portions 541 to 544 perpendicular to the extending direction is rectangular or square. The height of the side wall 504 in the normal direction of the main surface 503a is, for example, 0.5 to 1.0 mm. The side wall 504 is bonded to the main surface 503a of the base 503 via a bonding material such as silver solder.

The input lead 550 and the output lead 560 are plate-like members made of metal, for example, a thin metal plate of copper, a copper alloy, or an iron alloy. One end of the input lead 550 in the direction X is attached to the upper surface of a portion 541 of the side wall 504. Input lead 550 is insulated from the main surface 503a of the base 503 by the portion 541 of the side wall 504. One end of the output lead 560 in the direction X is attached to the upper surface of a portion 542 of the side wall 504. Output lead 560 is insulated from the main surface 503a of the base 503 by the portion 542 of the side wall 504.

The transistor 1A, the input matching circuit 506, the output matching circuit 508, and the output capacitor 509 are mounted in a region surrounded by the side wall 504 on the main surface 503a of the base 503. The transistor 1A, the input matching circuit 506, the output matching circuit 508, and the output capacitor 509 are provided in this order from the portion 541 of the side wall 504. The input matching circuit 506 and the output matching circuit 508 are, for example, parallel plate capacitors in which electrodes are provided on the upper and lower surfaces of the ceramic substrate.

The input matching circuit 506, the transistor 1A and the output matching circuit 508 are fixed on the base 503 by a conductive bonding material such as, for example, a sintered conductive paste. The conductive bonding material contains at least one of Ag, Au and Cu. In an embodiment, the conductive bonding material is a sintered silver paste. The conductive bonding material for fixing the transistor 1A is interposed between the backside metal film 45 of the transistor 1A and the main surface 503a of the base 503, electrically connects them, and strongly bonds them. The input matching circuit 506 is mounted on the input side of the transistor 1A, and the output matching circuit 508 is mounted on the output side of the transistor 1A. The input matching circuit 506 is electrically connected through a plurality of bonding wires (not shown) to the transistor 1A, the transistor 1A is electrically connected through a plurality of bonding wires (not shown) to the output matching circuit 508, the output matching circuit 508 is electrically connected through a plurality of bonding wires (not shown) to the output capacitor 509, and the output capacitor 509 is electrically connected through a plurality of bonding wires (not shown) to the output lead 560.

The input matching circuit 506 performs impedance matching between the input lead 550 and the transistor 1A. One end of the input matching circuit 506 is electrically connected to the input lead 550 through a bonding wire. The other end of the input matching circuit 506 is electrically connected to the gate pad 31 (see FIG. 8) of the transistor 1A through a bonding wire.

Output matching circuit 508 adjusts its impedance between transistor 1A and output lead 560 to provide the desired output of the high frequency signal appearing on output lead 560 with maximum efficiency. One end of the output matching circuit 508 is electrically connected to the portion 33a (see FIG. 8) of the drain wiring 33 of the transistor 1A through a bonding wire. The other end of the output matching circuit 508 is electrically connected to the output lead 560 via a bonding wire and the output capacitor 509.

In manufacturing the semiconductor device 500, the transistor 1A manufactured by the method according to the third embodiment is mounted on the base 503 using a conductive bonding material (for example, sintered silver paste) containing Ag. Specifically, sintered silver paste is applied onto a predetermined region of the main surface 503a of the base 503, and the transistor 1A is disposed thereon. Next, heat treatment is performed (for example, at 200° C. for 1 hour under $N_2$ atmosphere). Thereby, the solvent of the sintered type silver paste is volatilized, and the metal containing Ag is sintered.

The semiconductor device 500 of the fourth embodiment includes the transistor 1A of the third embodiment. Therefore, dendrite growth caused by the ion migration of the conductive bonding material interposed between the transistor 1A and the main surface 503a of the base 503 is suppressed, and a short circuit between the main surface 503a of the base 503 and the gate pad 31 can be reduced. Further, as in the fourth embodiment, when the package 501 for housing the transistor 1A has a non-hermetic structure, the usefulness of the transistor 1A is more remarkable.

The semiconductor device and the method of manufacturing the same according to the present disclosure are not limited to the embodiments described above, and various other modifications are possible. For example, although the contents of the present disclosure are applied to the field effect transistor in the third embodiment, the present disclosure is not limited to this.

What is claimed is:

1. A semiconductor device comprising:
  a semiconductor chip in which a field effect transistor mainly containing GaN is formed on a surface of a SiC semiconductor substrate, the semiconductor chip having a back surface and a backside metal film on the back surface;
  a metal base having a surface opposing the back surface of the semiconductor chip, the back surface of the semiconductor chip being mounted on the opposing surface of the metal base through a conductive adhesive material containing Ag; and
  a resin mold configured to seal the semiconductor chip,
  wherein a metal having wettability lower than wettability of Au or Cu with respect to Ag is exposed in a region extending along an edge of the back surface of the semiconductor chip,
  wherein the backside metal film is spaced away from a side surface of the SiC semiconductor substrate, and
  wherein the metal is exposed from the backside metal film in the region.

2. The semiconductor device according to claim 1, wherein the metal is NiCr, Ti or Ta.

3. The semiconductor device according to claim 2, wherein the metal exposed on the region has a width of 20 to 30 µm.

4. The semiconductor device according to claim 1,
  wherein the metal is exposed from the backside metal film by overhanging the backside metal film in the region.

5. A semiconductor device comprising:
  a substrate mounted on a metal surface of a base, and having a main surface and a back surface, the main surface including a device region and the back surface facing the metal surface;
  an electrode pad provided on the main surface along a side face of the substrate;
  a backside metal film provided on the back surface, the backside metal film being spaced away from the side face of the substrate;
  a conductive bonding material located between the backside metal film and the metal surface of the base; and
  a polyimide wall provided on the back surface between the side face of the substrate and the backside metal film, the polyimide wall extending along an edge of the backside metal film,
  wherein the conductive bonding material is in contact with the backside metal film and the metal surface of the base.

6. The semiconductor device according to claim 5,
  wherein the conductive bonding material contains Ag and is located interposed between the backside metal film and the metal surface of the base.

* * * * *